(12) United States Patent
Wang et al.

(10) Patent No.: US 11,545,605 B2
(45) Date of Patent: Jan. 3, 2023

(54) DISPLAY PANEL AND METHOD OF FABRICATING SAME

(71) Applicant: Au Optronics Corporation, Hsinchu (TW)

(72) Inventors: Hsun-Yi Wang, Hsinchu (TW); Chan-Jui Liu, Hsinchu (TW); Chiao-Li Huang, Hsinchu (TW); Ching-Liang Huang, Hsinchu (TW); Chun-Cheng Cheng, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 17/519,556

(22) Filed: Nov. 4, 2021

(65) Prior Publication Data
US 2022/0376150 A1    Nov. 24, 2022

(30) Foreign Application Priority Data

May 19, 2021    (TW) ................................. 110118058

(51) Int. Cl.
| | |
|---|---|
| H01L 33/60 | (2010.01) |
| H01L 25/075 | (2006.01) |
| H01L 33/00 | (2010.01) |
| G06F 3/044 | (2006.01) |
| G06F 3/041 | (2006.01) |
| H01L 33/62 | (2010.01) |

(52) U.S. Cl.
CPC .............. *H01L 33/60* (2013.01); *G06F 3/044* (2013.01); *G06F 3/0412* (2013.01); *H01L 25/0753* (2013.01); *H01L 33/005* (2013.01); *H01L 33/62* (2013.01); *H01L 2933/0058* (2013.01); *H01L 2933/0066* (2013.01)

(58) Field of Classification Search
CPC ....... G06F 3/0412; G06F 3/044; H01L 33/60; H01L 33/005; H01L 33/62; H01L 2933/0058; H01L 2933/0066
See application file for complete search history.

(56) References Cited

U.S. PATENT DOCUMENTS

| | | | |
|---|---|---|---|
| 2017/0062674 A1 | 3/2017 | Kwon et al. | |
| 2017/0301724 A1 | 10/2017 | Lee | |

(Continued)

FOREIGN PATENT DOCUMENTS

| | | |
|---|---|---|
| CN | 107302011 | 10/2017 |
| CN | 106684108 | 10/2019 |

(Continued)

*Primary Examiner* — Kenneth B Lee, Jr.
(74) *Attorney, Agent, or Firm* — JCIPRNET

(57) ABSTRACT

A display panel including a pixel circuit substrate, a planarization layer, a plurality of bonding pads, a plurality of light-emitting devices, a plurality of auxiliary electrodes, and a reflective structure layer is provided. The pixel circuit substrate has a plurality of signal lines. The planarization layer covers the signal lines. The bonding pads are disposed on the planarization layer and are electrically connected to the signal lines. The light-emitting devices are electrically bonded to the bonding pads. The auxiliary electrodes are disposed between the bonding pads. The reflective structure layer is disposed between the light-emitting devices and overlaps at least part of the auxiliary electrodes and the bonding pads. A method of fabricating the display panel is also provided.

21 Claims, 21 Drawing Sheets

(56) References Cited

U.S. PATENT DOCUMENTS

| | | | |
|---|---|---|---|
| 2017/0373125 A1* | 12/2017 | Youk | H01L 27/3262 |
| 2019/0157248 A1 | 5/2019 | Lee et al. | |
| 2020/0066788 A1 | 2/2020 | Lee | |
| 2021/0124448 A1* | 4/2021 | Lee | G06F 3/0443 |
| 2021/0173244 A1* | 6/2021 | Jeong | G02F 1/1368 |
| 2021/0202668 A1* | 7/2021 | Kwon | H01L 27/3258 |

FOREIGN PATENT DOCUMENTS

| | | |
|---|---|---|
| CN | 111048648 | 4/2020 |
| TW | 202127654 | 7/2021 |

\* cited by examiner

DISPLAY PANEL AND METHOD OF FABRICATING SAME

CROSS-REFERENCE TO RELATED APPLICATION

This application claims the priority benefit of Taiwanese application no. 110118058, filed on May 19, 2021. The entirety of the above-mentioned patent application is hereby incorporated by reference herein and made a part of this specification.

BACKGROUND

Technical Field

The disclosure relates to an electronic apparatus and a method of fabricating the same. Particularly, the disclosure relates to a display panel and a method of fabricating the same.

Description of Related Art

A light-emitting diode (LED) display panel includes an active device substrate and a plurality of light-emitting diode elements transferred on the active device substrate. Inheriting the properties of light-emitting diodes, the light-emitting diode display panel is expected to become the mainstream in the next generation of display panels because of power saving, high efficiency, high brightness, and fast response time.

To increase light utilization efficiency of the light-emitting diode display panel, a method of disposing reflective banks between the light-emitting diode elements is proposed. The reflective banks are mostly made of organic resin materials in a semiconductor manufacturing process. As a result, such reflective banks do not have high reflectivity in the visible light waveband (e.g., less than 50%), and the number of steps in the manufacturing process of the display panel may be increased.

SUMMARY

The disclosure provides a display panel with greater light utilization efficiency.

The disclosure provides a method of fabricating a display panel, in which a reflective structure layer with greater reflectivity can be fabricated in a relatively simple way.

A display panel of the disclosure includes a pixel circuit substrate, a planarization layer, a plurality of bonding pads, a plurality of light-emitting devices, a plurality of auxiliary electrodes, and a reflective structure layer. The pixel circuit substrate has a plurality of signal lines. The planarization layer covers the signal lines. The bonding pads are disposed on the planarization layer and are electrically connected to the signal lines. The light-emitting devices are electrically bonded to the bonding pads. The auxiliary electrodes are disposed between the bonding pads. The reflective structure layer is disposed between the light-emitting devices and overlaps at least part of the auxiliary electrodes and the bonding pads.

In an embodiment of the disclosure, the display panel further includes a cladding layer. The cladding layer covers the light-emitting devices, the reflective structure layer, the bonding pads, and the auxiliary electrodes.

In an embodiment of the disclosure, the reflective structure layer of the display panel is electrically connected to at least part of the auxiliary electrodes and the bonding pads.

In an embodiment of the disclosure, the reflective structure layer of the display panel has a reflective surface facing each of the light-emitting devices. An included angle between the reflective surface and a bonding surface of each of the bonding pads or an included angle between the reflective surface and a surface of each of the auxiliary electrodes is between 65 degrees and 70 degrees. The reflective structure layer has a structural height in a normal direction of the bonding surface. Each of the light-emitting devices has a device height in the normal direction of the bonding surface. A ratio of the structural height to the device height is between 2 and 3.

In an embodiment of the disclosure, the reflective structure layer of the display panel includes a high-reflectivity material layer and a low-reflectivity material layer. The high-reflectivity material layer is located between at least part of the auxiliary electrodes and the bonding pads and the low-reflectivity material layer.

In an embodiment of the disclosure, the reflective structure layer of the display panel includes a plurality of first reflective patterns. The first reflective patterns and the light-emitting devices are alternately arranged along a first direction.

In an embodiment of the disclosure, the light-emitting devices of the display panel includes a plurality of first light-emitting devices, a plurality of second light-emitting devices, and a plurality of third light-emitting devices. The display panel has a plurality of display pixel areas. One of the first light-emitting devices, one of the second light-emitting devices, and one of the third light-emitting devices are disposed in each of the display pixel areas. The reflective structure layer further includes a plurality of second reflective patterns. The display pixel areas and the second reflective patterns are alternately arranged along a second direction. The second direction intersects the first direction.

In an embodiment of the disclosure, the reflective structure layer of the display panel further includes a plurality of second reflective patterns. The second reflective patterns and the light-emitting devices are alternately arranged along a second direction. The second direction intersects the first direction.

In an embodiment of the disclosure, the display panel further includes an electroplated electrode. The electroplated electrode is disposed on the planarization layer and electrically connected to the auxiliary electrodes.

In an embodiment of the disclosure, the reflective structure layer of the display panel overlaps the auxiliary electrodes and the bonding pads.

In an embodiment of the disclosure, the display panel further includes a plurality of sensing electrodes. The sensing electrodes are disposed between the auxiliary electrodes and the pixel circuit substrate. The reflective structure layer is electrically connected to the auxiliary electrodes. The sensing electrodes respectively overlap the auxiliary electrodes.

A method of fabricating a display panel of the disclosure includes forming a planarization layer on a pixel circuit substrate, forming a conductive layer on the planarization layer, forming a cladding layer, and performing an electroplating process to form a reflective structure layer in a plurality of openings of the cladding layer. The conductive layer includes a plurality of bonding pads, a plurality of auxiliary electrodes, and a first electroplated electrode. The first electroplated electrode is electrically connected to the auxiliary electrodes. The openings of the cladding layer respectively overlap at least part of the auxiliary electrodes and the bonding pads.

In an embodiment of the disclosure, the above method further includes, before forming the cladding layer, performing bonding to electrically bond a plurality of light-emitting devices to the bonding pads.

In an embodiment of the disclosure, the pixel circuit substrate of the above method has a plurality of signal lines and a second electroplated electrode. The bonding pads penetrates the planarization layer and are electrically connected to the signal lines.

In an embodiment of the disclosure, the electroplating process of the above method includes applying an electric potential to the first electroplated electrode and the second electroplated electrode.

In an embodiment of the disclosure, after the electroplating process of the above method is completed, a cutting process is performed to remove the second electroplated electrode.

In an embodiment of the disclosure, the cutting process of the above method further includes removing the first electroplated electrode.

In an embodiment of the disclosure, the above method further includes, after completing the electroplating process, removing the cladding layer.

In an embodiment of the disclosure, the above method further includes, after removing the cladding layer, performing bonding to electrically bond a plurality of light-emitting devices to the bonding pads.

In an embodiment of the disclosure, the electroplating process of the above method includes forming a high-reflectivity material layer and forming a low-reflectivity material layer.

The high-reflectivity material layer is located between the conductive layer and the low-reflectivity material layer.

In an embodiment of the disclosure, the above method further includes, before forming the conductive layer, forming a plurality of sensing electrodes on the pixel circuit substrate. The sensing electrodes respectively overlap the auxiliary electrodes.

Based on the foregoing, in the display panel and the method of fabricating the same according to an embodiment of the disclosure, the reflective structure layer is formed through an electroplating process on the bonding pads or on the auxiliary electrodes located between the bonding pads. The reflective structure layer reflects light emitted at a large angle by the light-emitting devices electrically bonded to the bonding pads back within the viewing angle range of the display panel, thereby increasing the light utilization efficiency of the display panel. Moreover, since the reflective structure layer is made by an electroplating process, not only the steps in the manufacturing process can be reduced, but the formed reflective structure layer also has a relatively high reflectivity in the visible light waveband.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
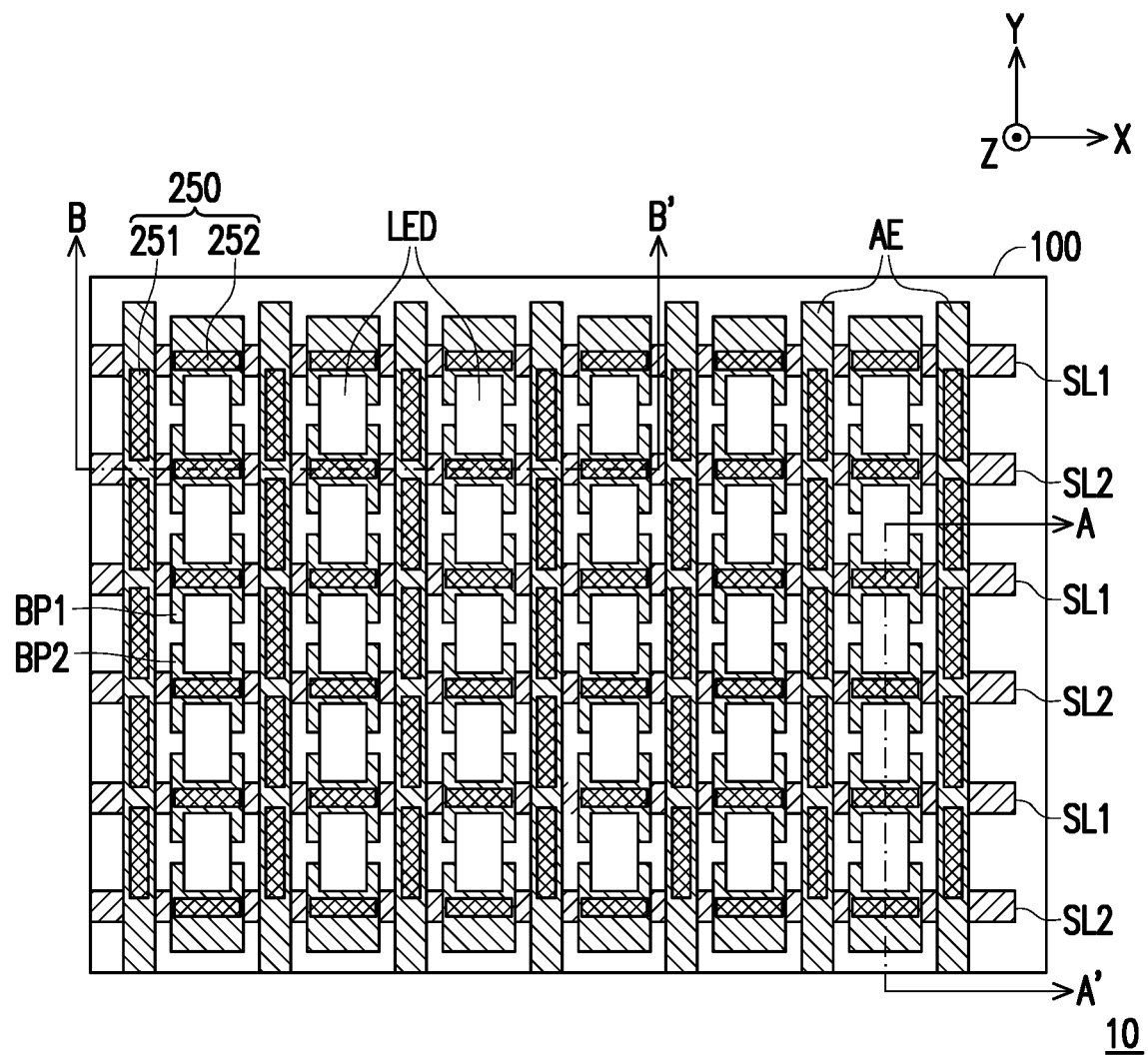
FIG. 1 is a schematic top view of a display panel according to a first embodiment of the disclosure.

The term "about", "approximately", "essentially", or "substantially" as used herein is inclusive of a stated value and means within an acceptable range of deviation for the particular value as determined by people having ordinary skill in the art, considering the measurement in question and the particular quantity of errors associated with measurement (i.e., the limitations of the measurement system). For instance, "about" may mean within one or more standard deviations or within ±30%, ±20%, ±10%, or ±5% of the stated value. Furthermore, a relatively acceptable range of deviation or standard deviation may be selected for the term "about", "approximately", "essentially", or "substantially" as used herein based on measurement properties, cutting properties, or other properties, instead of applying one standard deviation across all properties.

In the drawings, thicknesses of layers, films, panels, regions, etc., are exaggerated for the sake of clarity. It should be understood that when an element such as a layer, film, region, or substrate is referred to as being "on", or "connected to" another element, it may be directly on or connected to another element, or intermediate elements may also be present. In contrast, when an element is referred to as being "directly on" or "directly connected to" another element, no intermediate elements are present. As used herein, the term "connection" may refer to physical and/or electrical connection. Furthermore, "electrical connection" may encompass the presence of other elements between two elements.

Reference will now be made in detail to exemplary embodiments of the disclosure, examples of which are illustrated in the accompanying drawings. Wherever possible, the same reference numerals are used in the drawings and the description to refer to the same or similar parts.

Figure 2A:
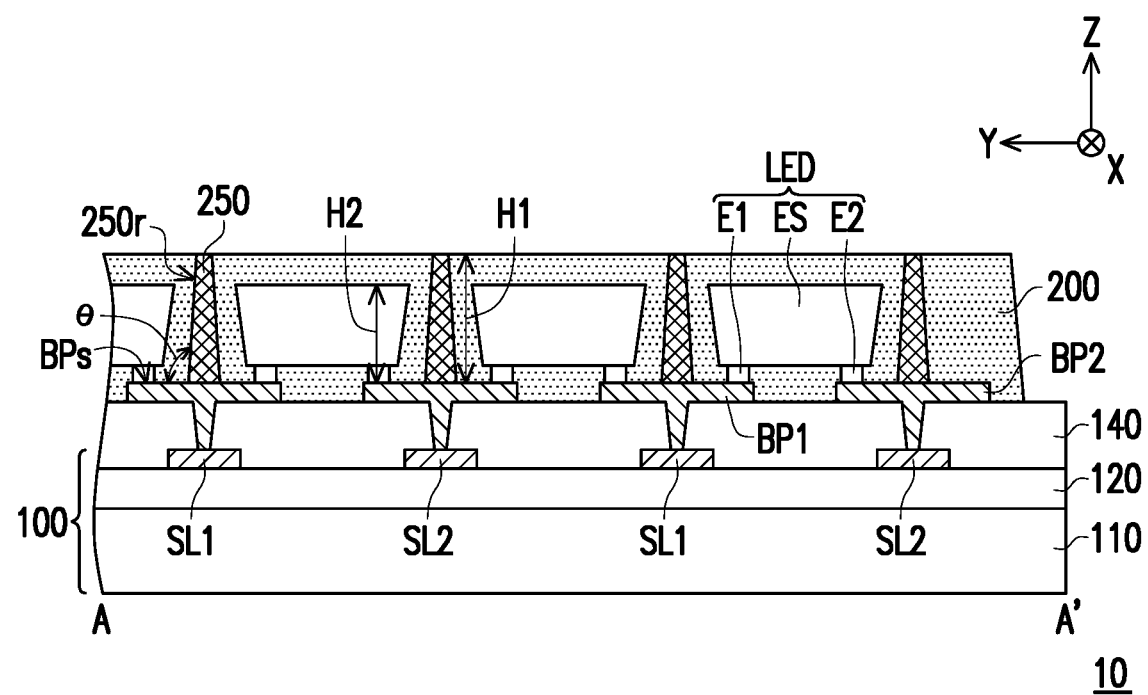
FIG. 2A and FIG. 2B are schematic cross-sectional views of the display panel of FIG. 1.
Figure 2B:
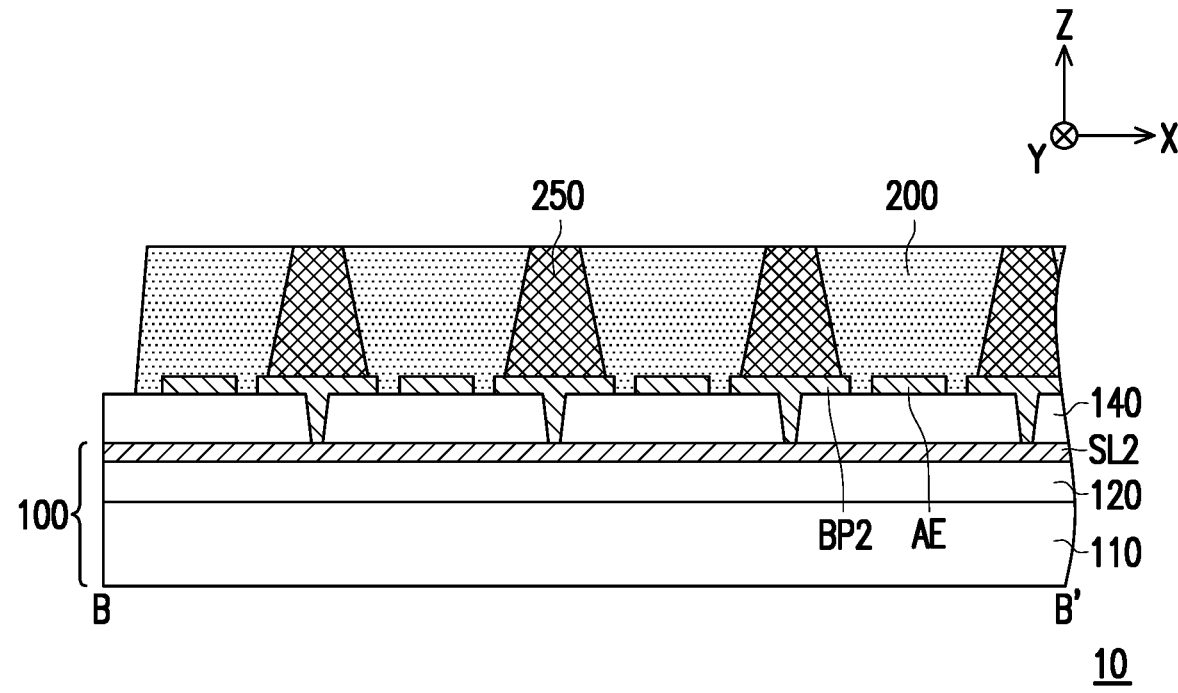
Figure 3:
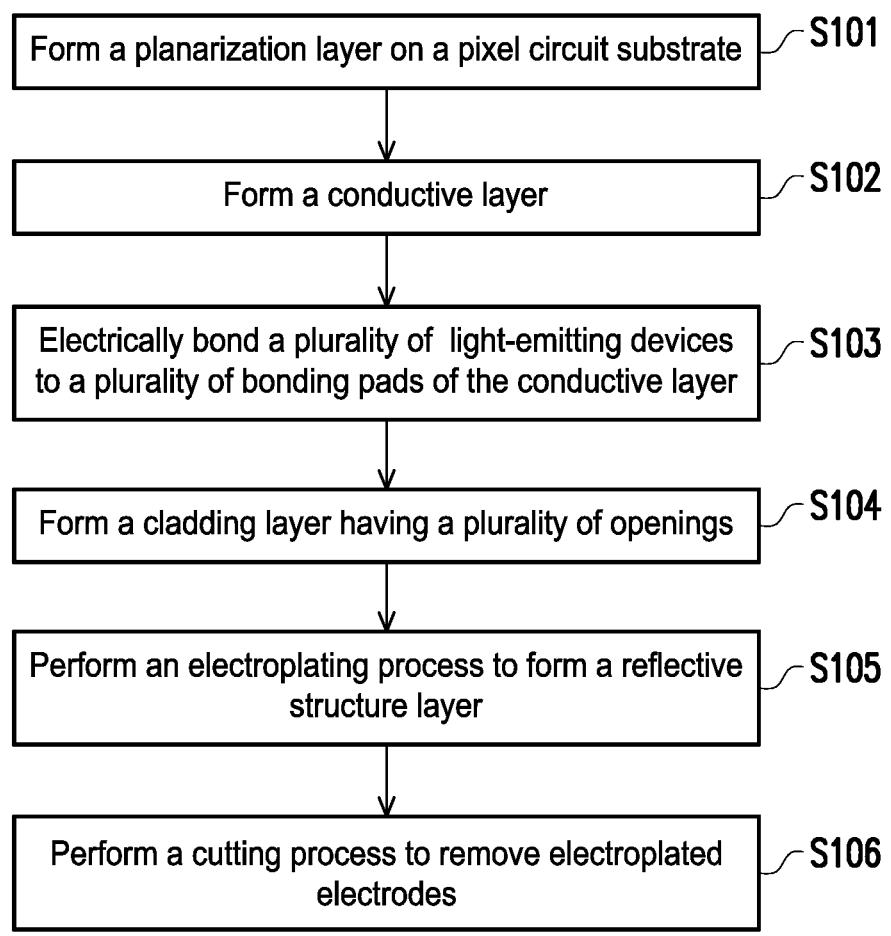
FIG. 3 is a flowchart of a method of fabricating the display panel of FIG. 1.

FIG. 1 is a schematic top view of a display panel according to a first embodiment of the disclosure. FIG. 2A and FIG. 2B are schematic cross-sectional views of the display panel of FIG. 1. FIG. 2A corresponds to section line A-A' of FIG. 1. FIG. 2B corresponds to section line B-B' of FIG. 1. FIG. 3 is a flowchart of a method of fabricating the display panel of FIG. 1. FIG. 4A to FIG. 6 are schematic views of a fabricating process of the display panel of FIG. 1. FIG. 4A to FIG. 4E correspond to section line C-C' of FIG. 6. FIG. 5A to FIG. 5E correspond to section line D-D' of FIG. 6. For the sake of clarity in presentation, illustration of planarization layer 140 and a cladding layer 200 of FIG. 2A and FIG. 2B is omitted in FIG. 1, and illustration of planarization layer 140 and the cladding layer 200 of FIG. 4E and FIG. 5E is omitted in FIG. 6.

With reference to FIG. 1, FIG. 2A, and FIG. 2B, a display panel 10 includes a pixel circuit substrate 100, a plurality of bonding pads, and a plurality of light-emitting devices LED. The bonding pads are disposed on the pixel circuit substrate 100 and are electrically connected to the pixel circuit substrate 100. The light-emitting devices LED are electrically bonded to the bonding pads. In this embodiment, the light-emitting device LED has an epitaxial structure layer ES, and has a first electrode E1 and a second electrode E2 that are located on the same side with the epitaxial structure layer ES and electrically connected to the epitaxial structure layer ES. That is, the light-emitting device LED of this embodiment may be a flip-chip type light-emitting diode (flip-chip type LED). In addition, the light-emitting device LED of this embodiment may be a micro-light-emitting diode (micro-LED), a mini-light-emitting diode (mini-LED), or other light-emitting diodes of different sizes or scales.

The bonding pads of the display panel 10 may be divided into a plurality of bonding pad groups. In addition, the bonding pad groups each include a first bonding pad BP1 and a second bonding pad BP2. For example, in this embodiment, each bonding pad is configured to electrically bond two light-emitting devices LED. In other words, any light-emitting device LED of this embodiment may share a bonding pad with another light-emitting device LED, but the disclosure is not limited thereto. In other embodiments, each of the light-emitting devices LED may also be in a one-to-one correspondence with the bonding pad groups.

In this embodiment, the pixel circuit substrate 100 may include a substrate 110, a pixel circuit layer 120, and a plurality of signal lines. The pixel circuit layer 120 is disposed on the substrate 110, and the signal lines are disposed on the pixel circuit layer 120. For example, the signal lines of the pixel circuit substrate 100 may include a plurality of first signal lines SL1 and a plurality of second signal lines SL2. The first signal lines SL1 and the second signal lines SL2 are alternately arranged along a direction Y and extend in a direction X. The direction X may be substantially perpendicular to the direction Y. In this embodiment, a planarization layer 140 is also disposed between the pixel circuit layer 120 and the bonding pads, and the planarization layer 140 covers the signal lines. Based on the consideration of conductivity, the signal lines are generally made of metal materials.

In particular, each first bonding pad BP1 penetrates the planarization layer 140 to electrically connect one corresponding first signal line SL1, and each second bonding pad BP2 penetrates the planarization layer 140 to electrically connect one corresponding second signal line SL2. For example, the first signal lines SL1 and the second signal lines SL2 may be electrically coupled to respectively a system high voltage source (OVDD) and a system low voltage source (OVSS). Accordingly, the first electrode E1 and the second electrode E2 of the light-emitting devices LED may be respectively a P electrode and an N electrode. That is, the first electrode E1 and the second electrode E2 of the light-emitting devices LED may be electrically connected to respectively the P-type semiconductor layer and the N-type semiconductor layer of the epitaxial structure layer ES, but the disclosure is not limited thereto.

Furthermore, the display panel 10 further includes a plurality of auxiliary electrodes AE and a reflective structure layer 250. The auxiliary electrodes AE are disposed between the bonding pads (or the light-emitting devices LED). In this embodiment, the auxiliary electrodes AE and the bonding pads (e.g., the first bonding pads BP1 or the second bonding pads BP2) electrically connected to the same signal line (e.g., the first signal line SL1 or the second signal line SL2) may be alternately arranged along the direction X, and the auxiliary electrodes AE extend in the Y direction. For example, the auxiliary electrodes AE and the bonding pads may selectively belong to the same film layer. That is, the materials of the auxiliary electrodes AE and the bonding pads may be selectively the same, but the disclosure is not limited thereto. In other embodiments, the auxiliary electrodes and the bonding pads may also belong to different layers.

Based on the consideration of conductivity, the auxiliary electrodes AE and the bonding pads are generally manufactured using metal materials, but the disclosure is not limited thereto. In other embodiments, the auxiliary electrodes AE and the bonding pads may also be manufactured using metal oxides (e.g., indium zinc oxide or indium tin oxide), or other suitable conductive materials.

In this embodiment, the reflective structure layer 250 is disposed between the light-emitting devices LED, and overlaps the auxiliary electrodes AE and the bonding pads along the normal direction (e.g., a direction Z) of a bonding surface BPs of the bonding pads, but the disclosure is not limited thereto. For example, the reflective structure layer 250 may have a plurality of first reflective patterns 251 and a plurality of second reflective patterns 252 separated from each other. The first reflective patterns 251 and the light-emitting devices LED are alternately arranged along the direction X, and the second reflective patterns 252 and the light-emitting devices LED are alternately arranged along the direction Y.

Figure 15:
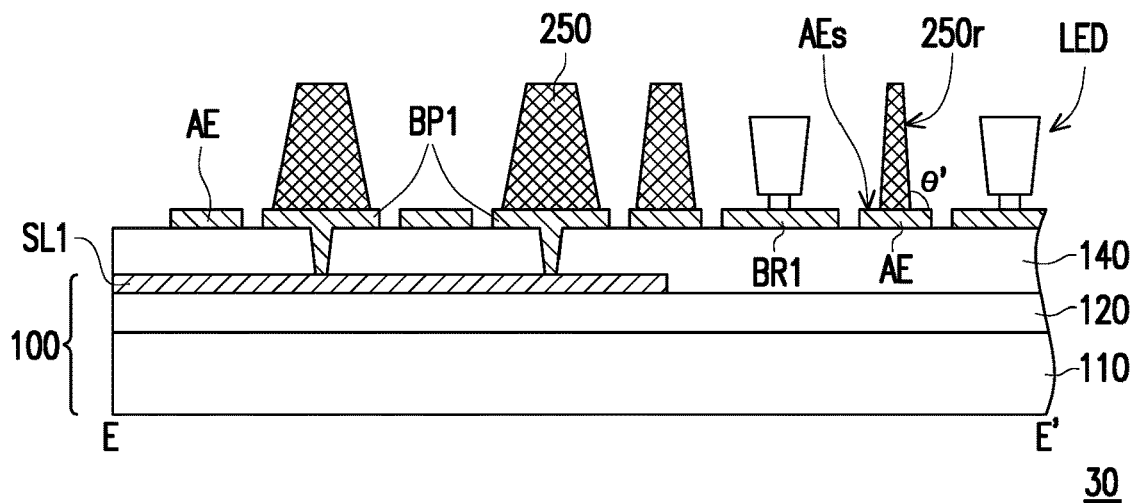
FIG. 15 is a schematic cross-sectional view of the display panel of FIG. 14.

Further to the above, the reflective structure layer 250 has a reflective surface 250r facing each light-emitting device LED, and an included angle θ between the reflective surface 250r and the bonding surface BPs of each of the bonding pads and/or an included angle θ' between the reflective surface 250r and a surface AEs of each of the auxiliary electrodes AE (as shown in FIG. 15) may be between 65 degrees and 70 degrees. In addition, the reflective structure layer 250 and the light-emitting devices LED respectively have a structural height H1 and a device height H2 in the normal direction (e.g., the direction Z) of the bonding surface BPs, and a ratio of the structural height H1 to the device height H2 is between 2 and 3. Accordingly, light emitted by the light-emitting devices LED at a larger angle can be more efficiently reflected back within the viewing angle range of the display panel 10, thereby increasing the overall light output of the display panel 10 within the viewing angle range.

In particular, the material of the reflective structure layer 250 may include copper, silver, aluminum, molybdenum, or other metal materials with high reflectivity. In this embodiment, since the reflective structure layer 250 is made of, for example, copper metal, the reflectivity of the reflective structure layer 250 in the visible light waveband (e.g., a wavelength range of 400 nm to 700 nm) is obviously higher than 50%, helping to further increase the light utilization efficiency of the display panel 10.

In this embodiment, the display panel 10 may also selectively include the cladding layer 200. The cladding layer 200 covers the light-emitting devices LED, the reflective structure layer 250, the bonding pads, and the auxiliary electrodes AE. The material of the cladding layer 200 includes, for example, inorganic insulating materials (e.g., silicon oxide or silicon nitride), organic insulating materials (e.g., organic resin), or other suitable light-transmitting insulating materials.

Since the material of the reflective structure layer 250 is a metal material, the reflective structure layer 250 may be made by a relatively simple electroplating process, which helps to reduce the number of steps in the manufacturing process of the display panel 10. The method of fabricating the display panel 10 will be exemplarily described below.

Figure 4A:
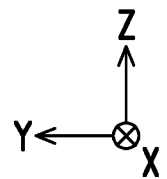
FIG. 4A to FIG. 6 are schematic views of a fabricating process of the display panel of FIG. 1.
Figure 4A:
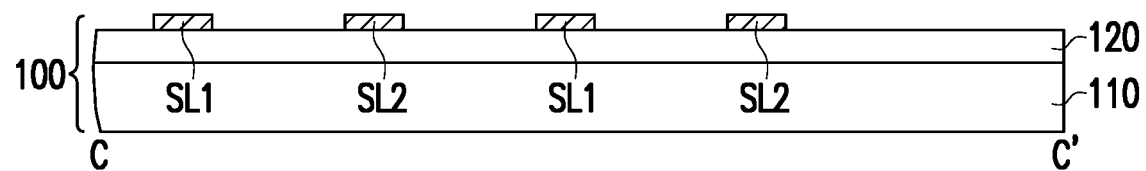
Figure 5A:
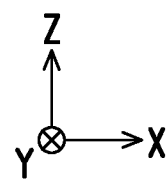
Figure 5A:
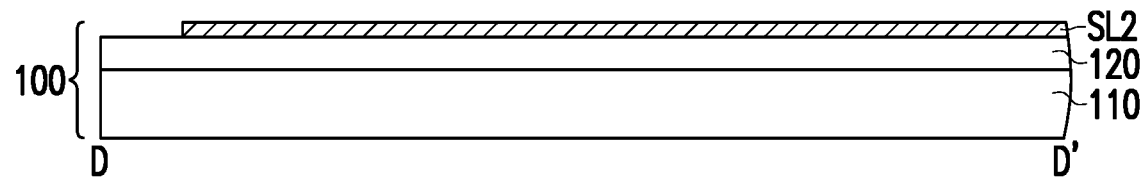
Figure 4B:
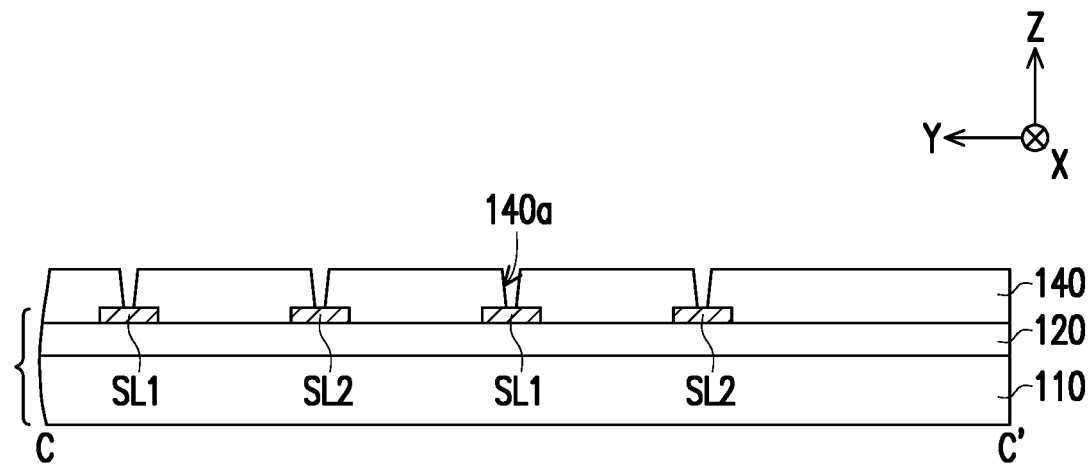
Figure 5B:
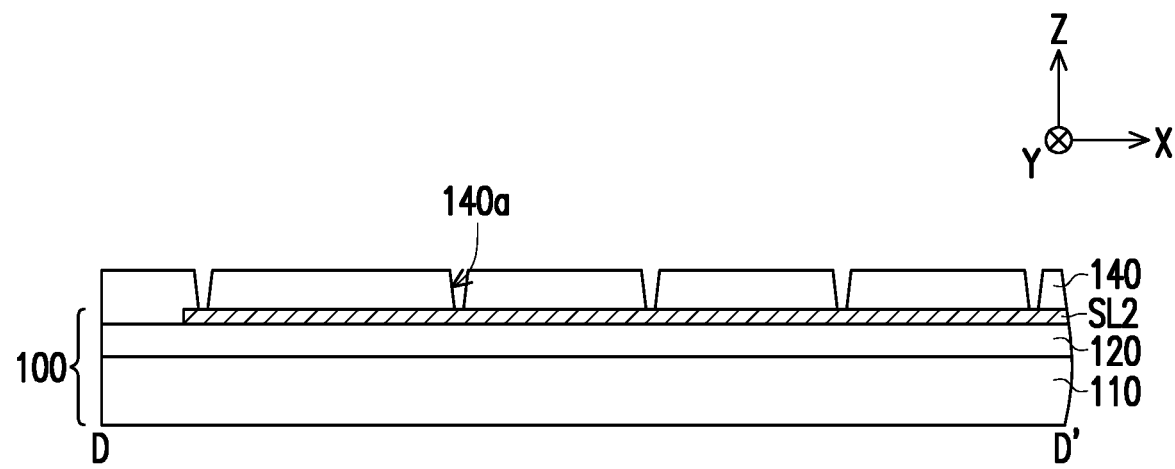

With reference to FIG. 3, FIG. 4A, and FIG. 5A, first, the pixel circuit layer 120 and a plurality of signal lines are fabricated on the substrate 110 to form the pixel circuit substrate 100. The signal lines include the first signal lines SL1 and the second signal lines SL2. Next, the planarization layer 140 is formed on the pixel circuit substrate 100 (step S101 of FIG. 3). The planarization layer 140 has a plurality of contact holes 140a overlapping the signal lines along the direction Z, as shown in FIG. 4B and FIG. 5B.

Figure 4C:
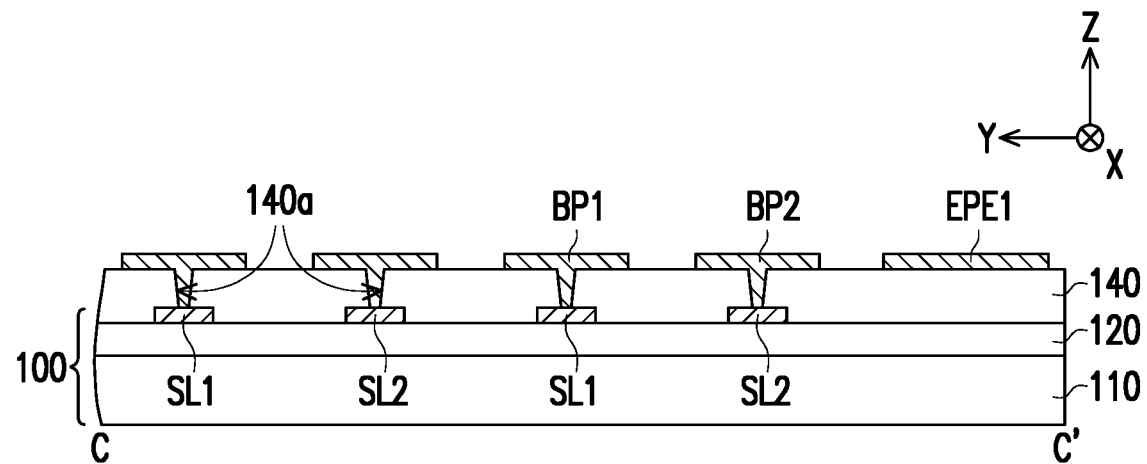
Figure 5C:
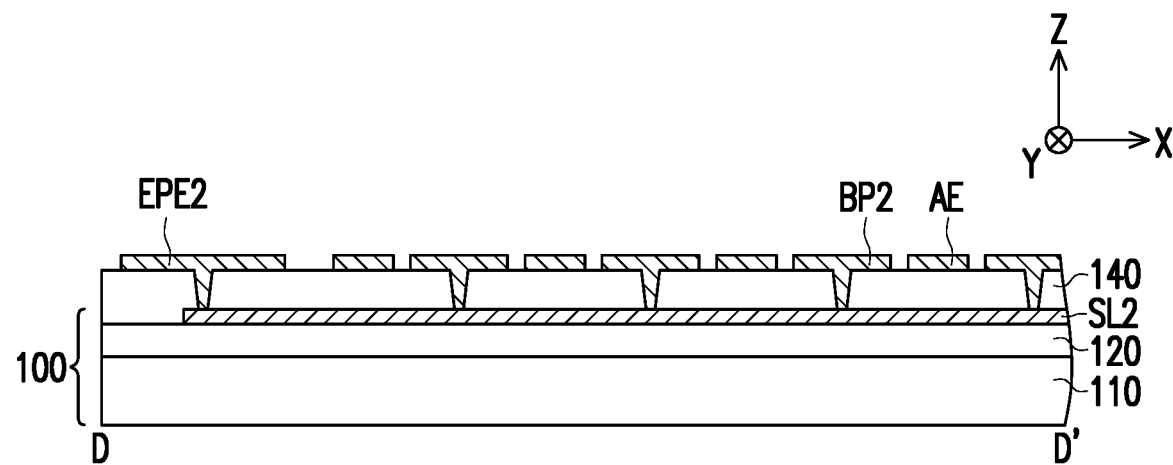
Figure 6:
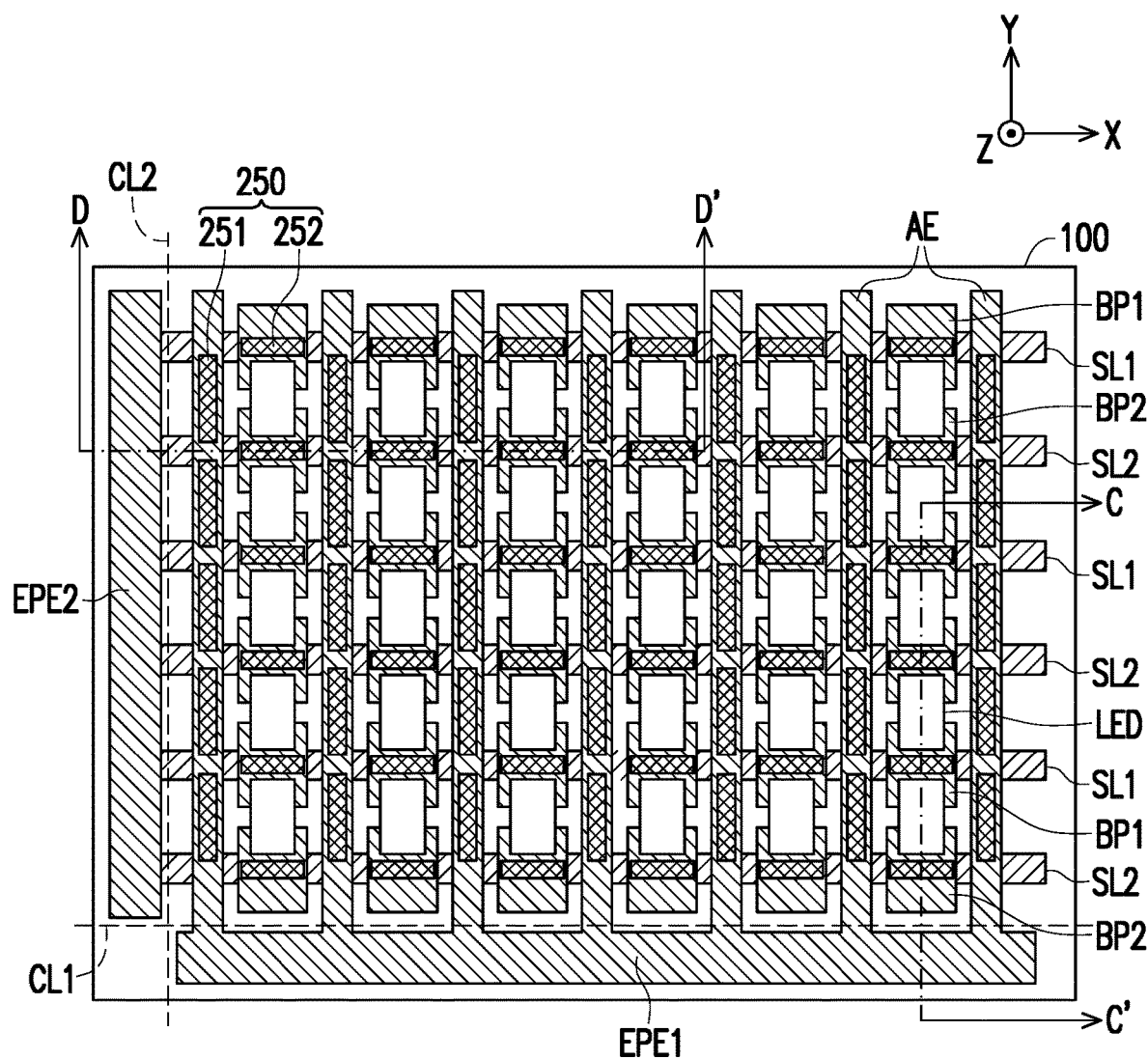

A conductive layer is formed on the planarization layer 140 (step S102 of FIG. 3), as shown in FIG. 4C and FIG. 5C. The conductive layer may include the first bonding pads BP1, the second bonding pads BP2, the auxiliary electrodes AE, an electroplated electrode EPE1, and an electroplated electrode EPE2. The bonding pads are respectively electrically connected to the signal lines through the contact holes 140a. In particular, the auxiliary electrodes AE are electrically connected to the electroplated electrode EPE1, and the first bonding pads BP1 and the second bonding pads BP2 are electrically connected to the electroplated electrode EPE2 respectively through the first signal lines SL1 and the second signal lines SL2 (as shown in FIG. 6).

Figure 4D:
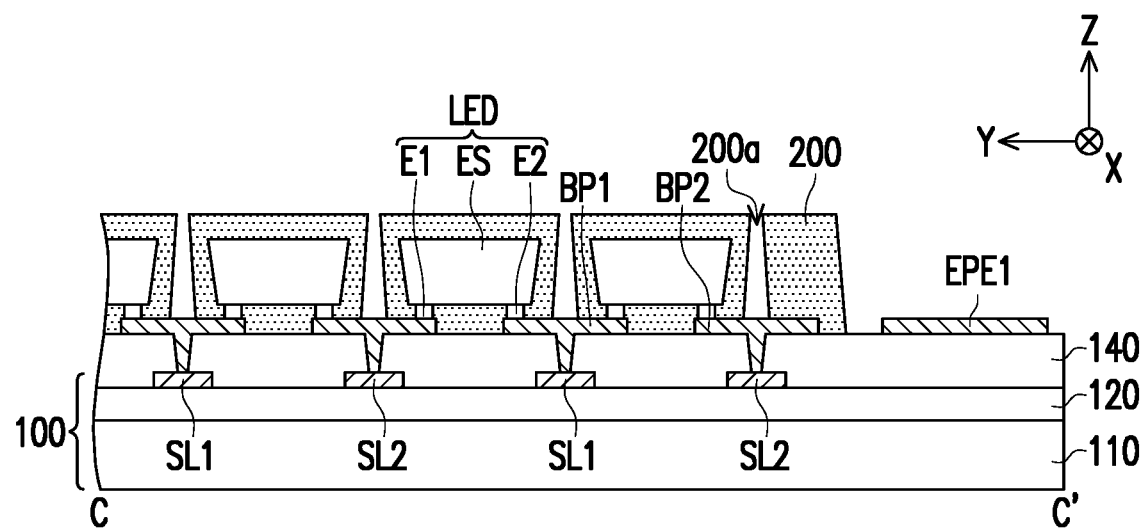
Figure 5D:
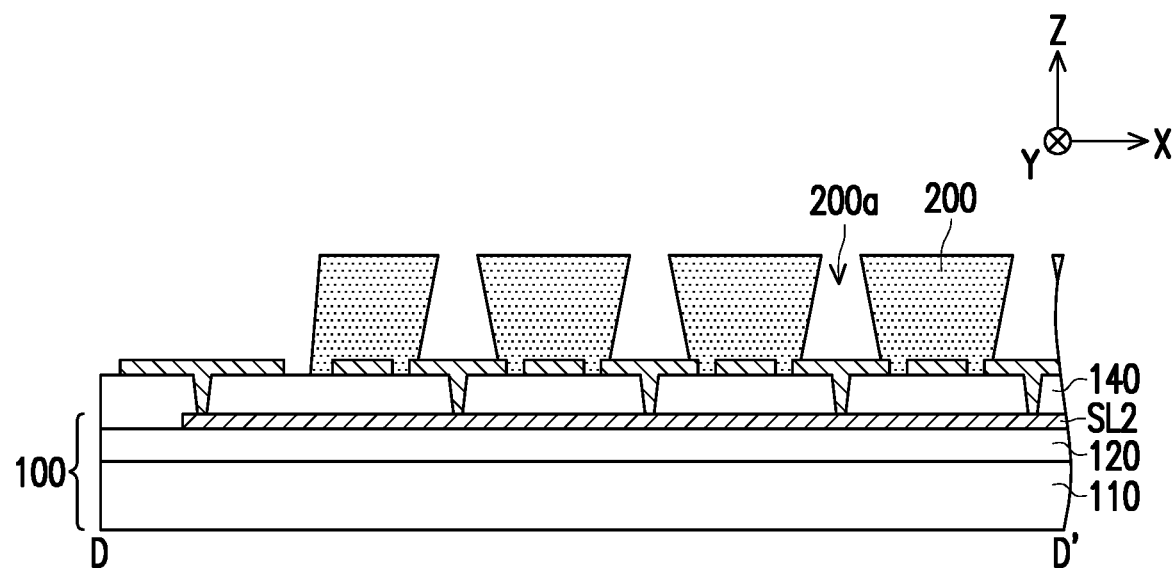
Figure 4E:
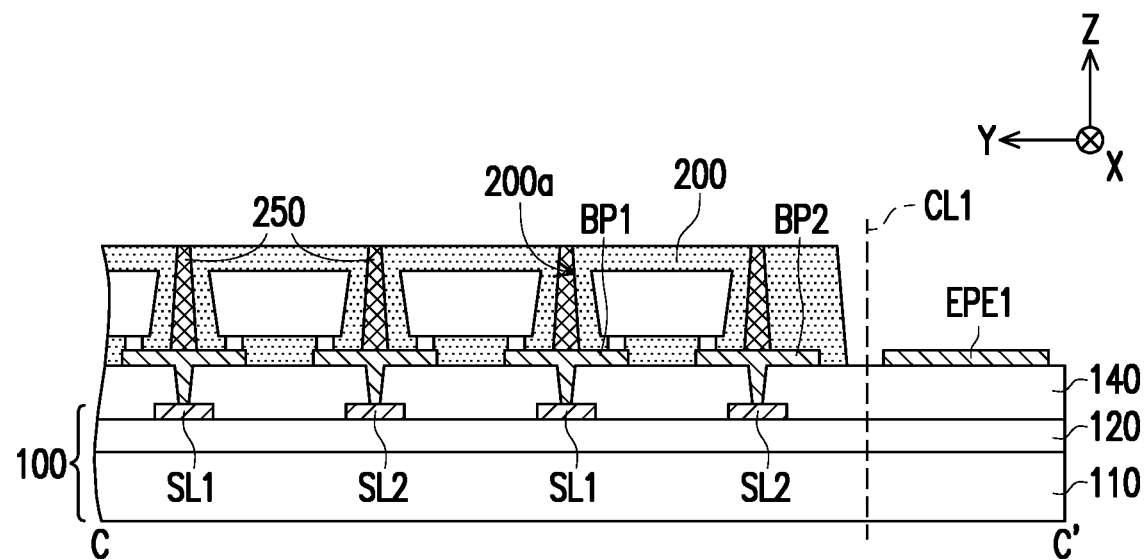
Figure 5E:
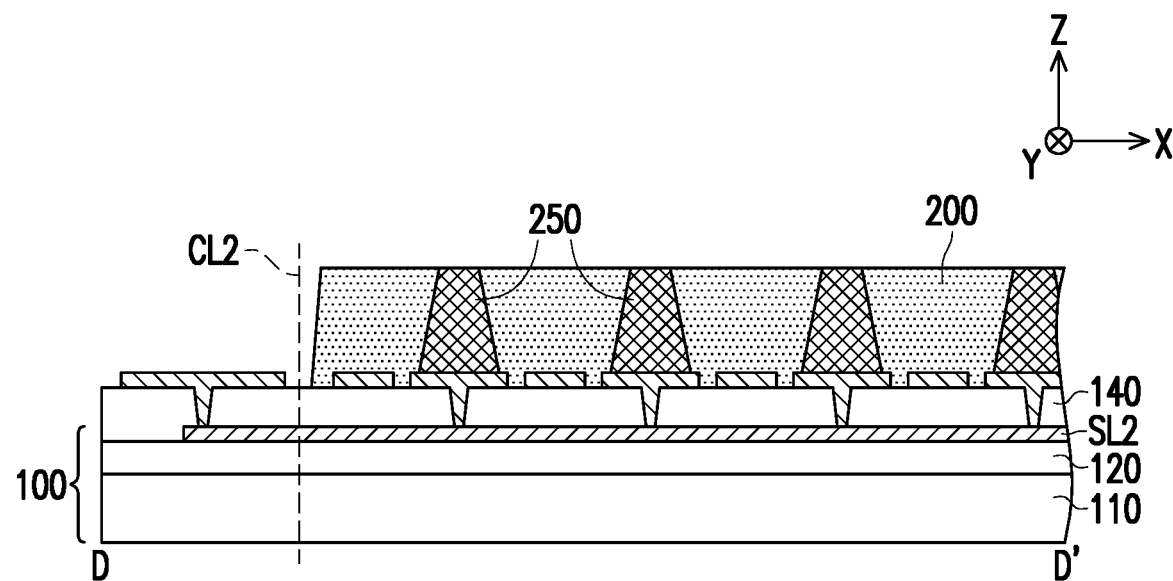

With reference to FIG. 3, FIG. 4D, and FIG. 5D, after the step of forming the conductive layer is completed, a step of bonding is performed to electrically bond the light-emitting devices LED to the bonding pads of the conductive layer (step S103). After the step of bonding the light-emitting devices LED is completed, the cladding layer 200 having a plurality of openings 200a is formed (step S104). The openings 200a of the cladding layer 200 respectively overlap the auxiliary electrodes AE, the first bonding pads BP1, and the second bonding pads BP2 along the direction Z. In this embodiment, since the light-emitting devices LED are, for example, micro-light-emitting diodes (micro-LEDs), the height of the cladding layer 200 along the direction Z is required to be greater than at least 10 μm so as to produce the reflective structure layer 250 with a sufficient height. Nonetheless, the disclosure is not limited thereto.

With reference to FIG. 3, FIG. 4E, and FIG. 5E, an electroplating process is performed to form the reflective structure layer 250 in the openings 200a of the cladding layer 200 (step S105). For example, steps of the electroplating process may include immersing the auxiliary electrodes AE and the bonding pads in an electroplating solution, and applying an electric potential to the electroplated electrode EPE1 and the electroplated electrode EPE2, such that the auxiliary electrodes AE and the bonding pads are provided with the electric potential to form the reflective structure layer 250 through an electrolysis reaction. In particular, since the reflective structure layer 250 is made by an electroplating process, the first reflective patterns 251 of the reflective structure layer 250 are electrically connected to the auxiliary electrodes AE, and the second reflective patterns 252 are electrically connected to the bonding pads.

After the electroplating process for the reflective structure layer 250 is completed, a cutting process is performed to remove electroplated electrodes (step S106). With reference to FIG. 6 together, in this embodiment, steps of the cutting process may include cutting along cutting line CL1 to remove the electroplated electrode EPE1 and cutting along cutting line CL2 to remove the electroplated electrode EPE2. Nonetheless, the disclosure is not limited thereto. In other embodiments, the cutting process may also include only the step of removing the electroplated electrode EPE2. By removing the electroplated electrode, the driving electrical property of the display panel can be ensured not to be affected by the electroplated circuit.

At this point, the fabrication of the display panel 10 of FIG. 1 is completed. The display panel 10 includes the pixel circuit substrate 100, the planarization layer 140, the first bonding pads BP1, the second bonding pads BP2, the light-emitting devices LED, the auxiliary electrodes AE, and the reflective structure layer 250. The pixel circuit substrate 100 has the first signal lines SL1 and the second signal lines SL2. In addition, the planarization layer 140 covers the signal lines. The bonding pads are disposed on the planarization layer 140 and are electrically connected to the signal lines. The light-emitting devices LED are electrically bonded to the bonding pads. The auxiliary electrodes AE are disposed between the bonding pads. The reflective structure layer 250 is disposed between the light-emitting devices LED, and overlaps the auxiliary electrodes AE and the bonding pads along the direction Z.

The reflective structure layer 250 disposed between the light-emitting devices LED reflects light emitted by the light-emitting devices LED at a large angle back within the viewing angle range of the display panel 10, thus producing light convergence and increasing the light utilization efficiency of the display panel 10. Moreover, by using the electroplating process to form the reflective structure layer 250, not only the steps in the manufacturing process of the display panel 10 can be reduced, but the formed reflective structure layer 250 can also have relatively high reflectivity in the visible light waveband, helping to further increase the light utilization efficiency of the display panel 10.

Hereinafter, some other embodiments will be provided for detailed description of the disclosure, in which the same components will be labeled with the same reference numerals, and the description of the same technical content will be omitted. For the omitted parts, reference may be made to the above embodiments, which will not be repeatedly described below.

Figure 7:
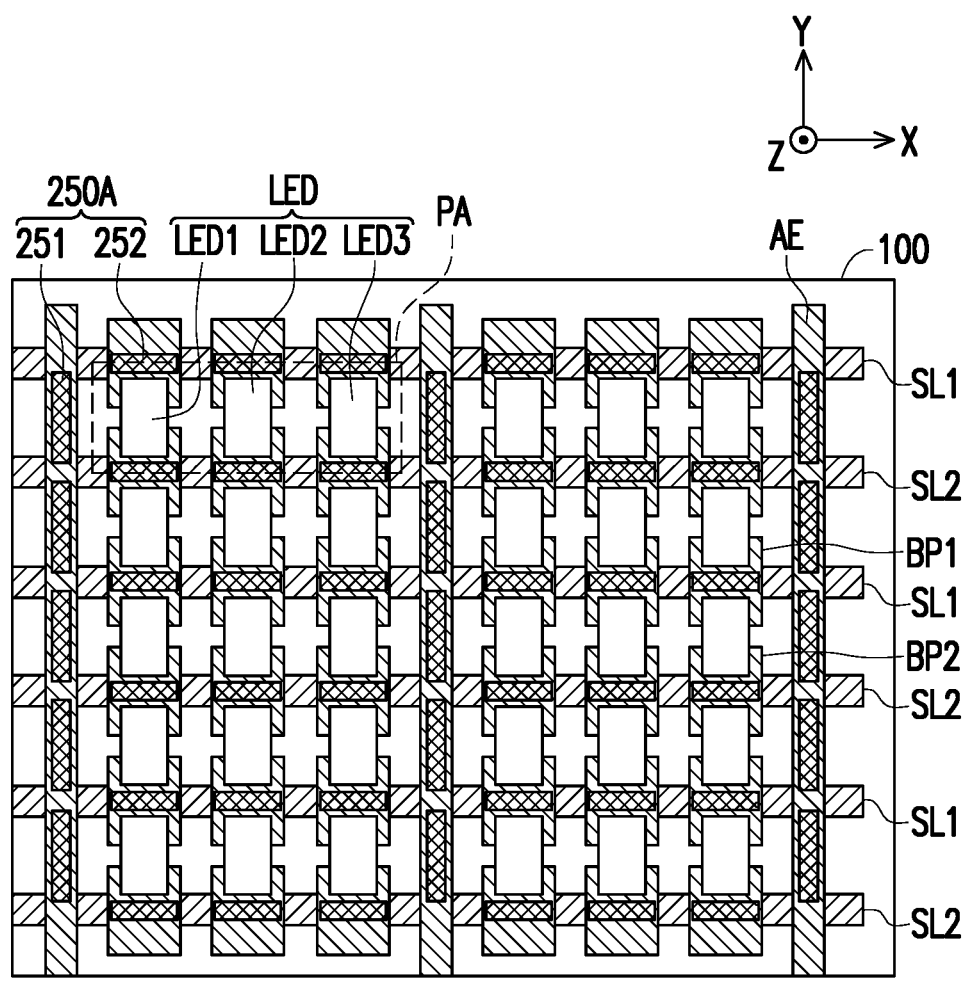
FIG. 7 is a schematic top view of a display panel according to a second embodiment of the disclosure.

FIG. 7 is a schematic top view of a display panel according to a second embodiment of the disclosure. With reference to FIG. 7, the difference between a display panel 10A of this embodiment and the display panel 10 of FIG. 1 lies in the configuration of the reflective structure layer.

Specifically, in the display panel 10A, the arrangement of the first reflective patterns 251 of a reflective structure layer 250A and the light-emitting devices LED is different from that of the display panel 10 of FIG. 1.

For example, in this embodiment, the display panel 10A has a plurality of display pixel areas PA. In addition, the light-emitting devices LED include a plurality of first light-emitting devices LED1, a plurality of second light-emitting devices LED2, and a plurality of third light-emitting devices LED3. One first light-emitting device LED1, one second light-emitting device LED2, and one third light-emitting device LED3 are disposed in each display pixel area PA. Here, the first light-emitting devices LED1, the second light-emitting devices LED2, and the third light-emitting devices LED3 are respectively configured to emit light of different colors, such as red light, green light, and blue light, but the disclosure is not limited thereto.

In particular, the first reflective patterns 251 of the reflective structure layer 250A and the display pixel areas PA are alternately arranged along the direction X. That is, the reflective structure layer 250A of this embodiment is not arranged around each of the light-emitting devices LED. Correspondingly, the auxiliary electrodes AE and the display pixel areas PA are also alternately arranged along the direction X. Notably, in this embodiment, the number of light-emitting devices LED disposed in each display pixel area PA is exemplified by using three light-emitting devices LED as an example. Nonetheless, it does not indicates that the disclosure is limited to the disclosed content of the drawings. In other embodiments, the number of light-emitting devices LED disposed in each display pixel area PA may be adjusted as required in actual application.

Figure 8:
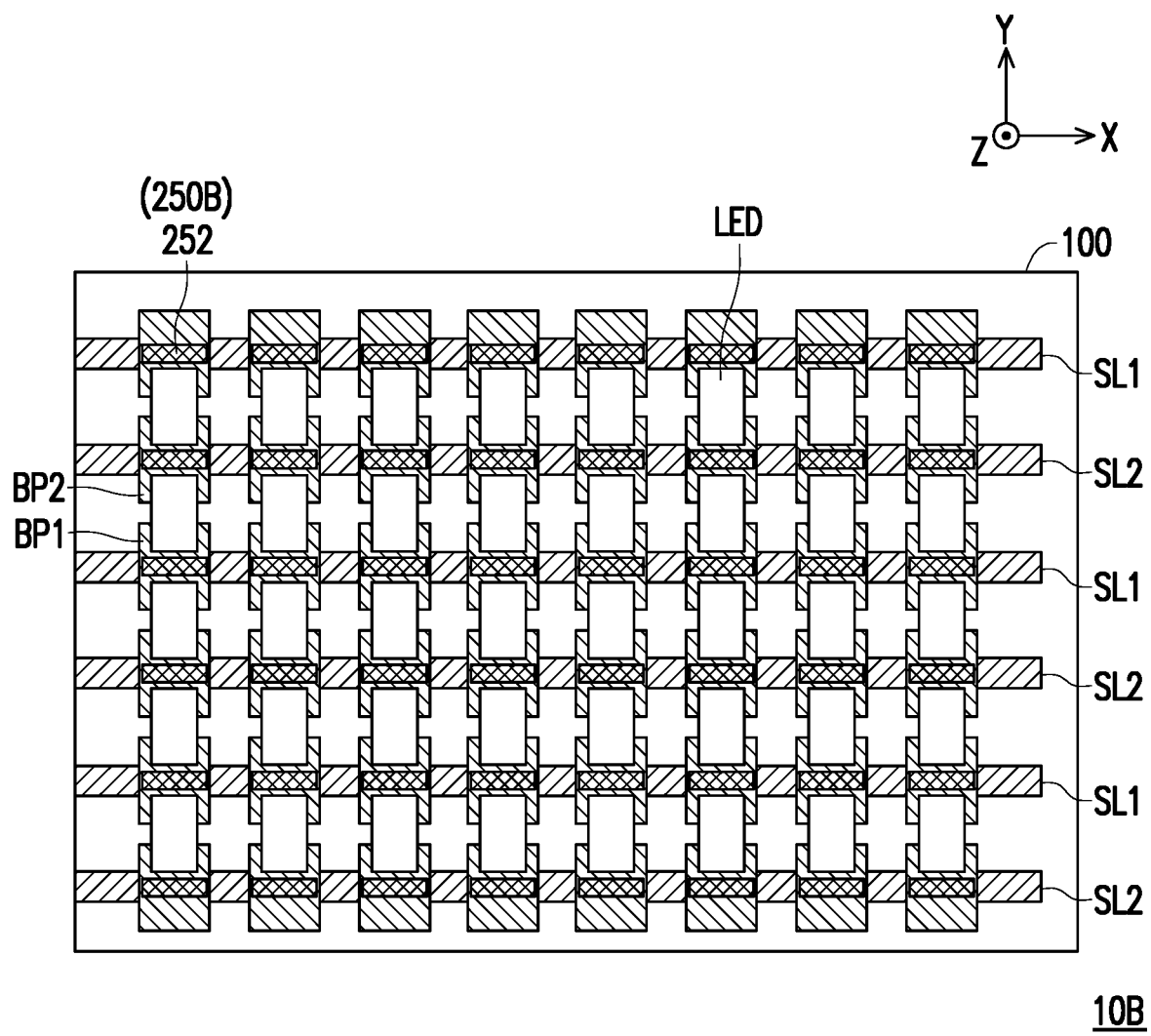
FIG. 8 is a schematic top view of a display panel according to a third embodiment of the disclosure.
Figure 9:
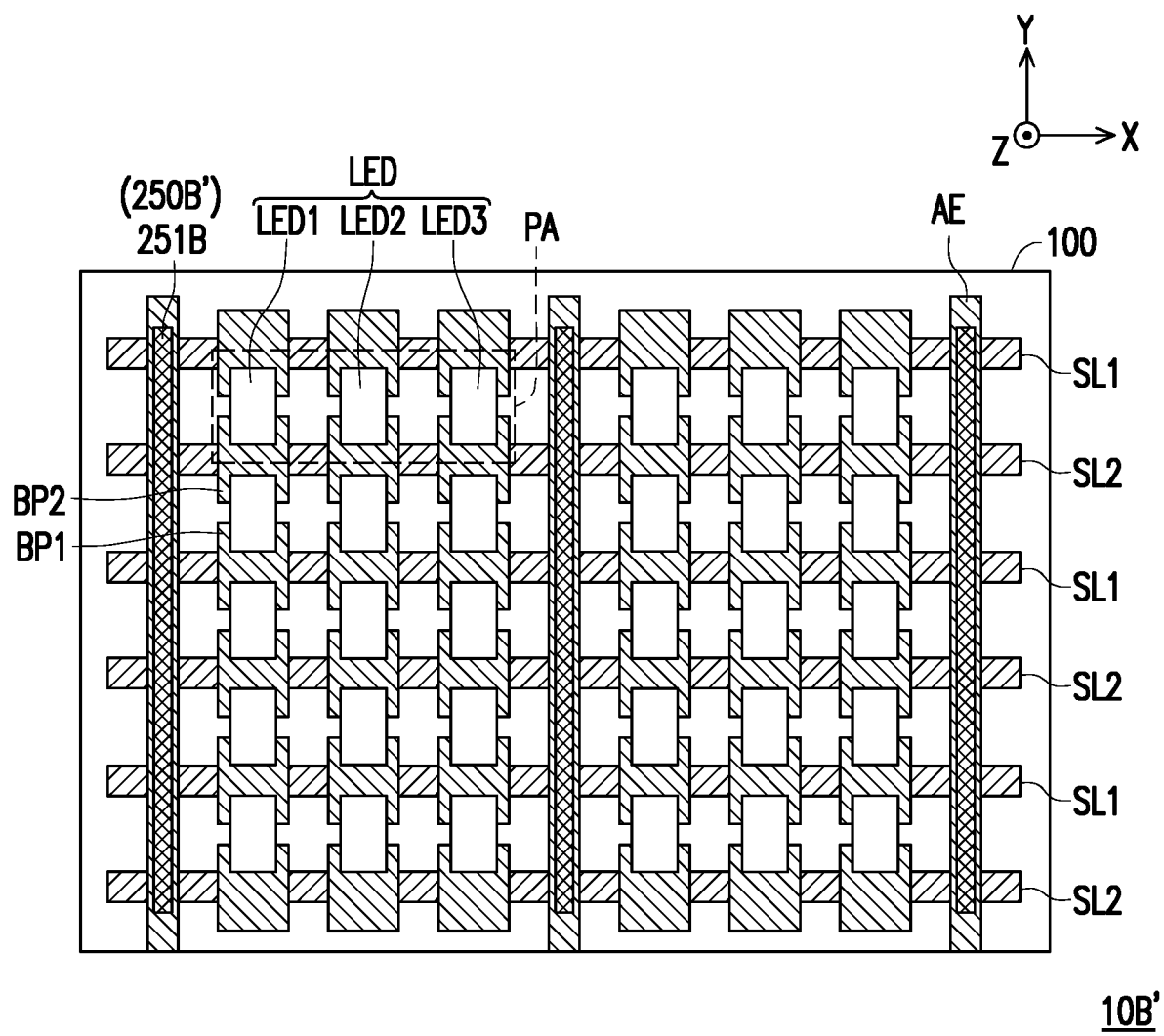
FIG. 9 is a schematic top view of a display panel according to a fourth embodiment of the disclosure.

FIG. 8 is a schematic top view of a display panel according to a third embodiment of the disclosure. FIG. 9 is a schematic top view of a display panel according to a fourth embodiment of the disclosure. With reference to FIG. 8, the difference between a display panel 10B of this embodiment and the display panel 10A of FIG. 7 lies in that a reflective structure layer 250B of the display panel 10B is disposed only on opposite sides of each light-emitting device LED along the direction Y. That is, the reflective structure layer 250B has only the second reflective patterns 252. Nonetheless, the disclosure is not limited thereto. In other embodiments, a reflective structure layer 250B' of a display panel 10B' may have only a plurality of first reflective patterns 251B extending in the direction Y. The first reflective patterns 251B and the display pixel areas PA are alternately arranged along the direction X. In addition, each first reflective pattern 251 extends across multiple first signal lines SL1 and multiple second signal lines SL2, as shown in FIG. 9.

Figure 10:
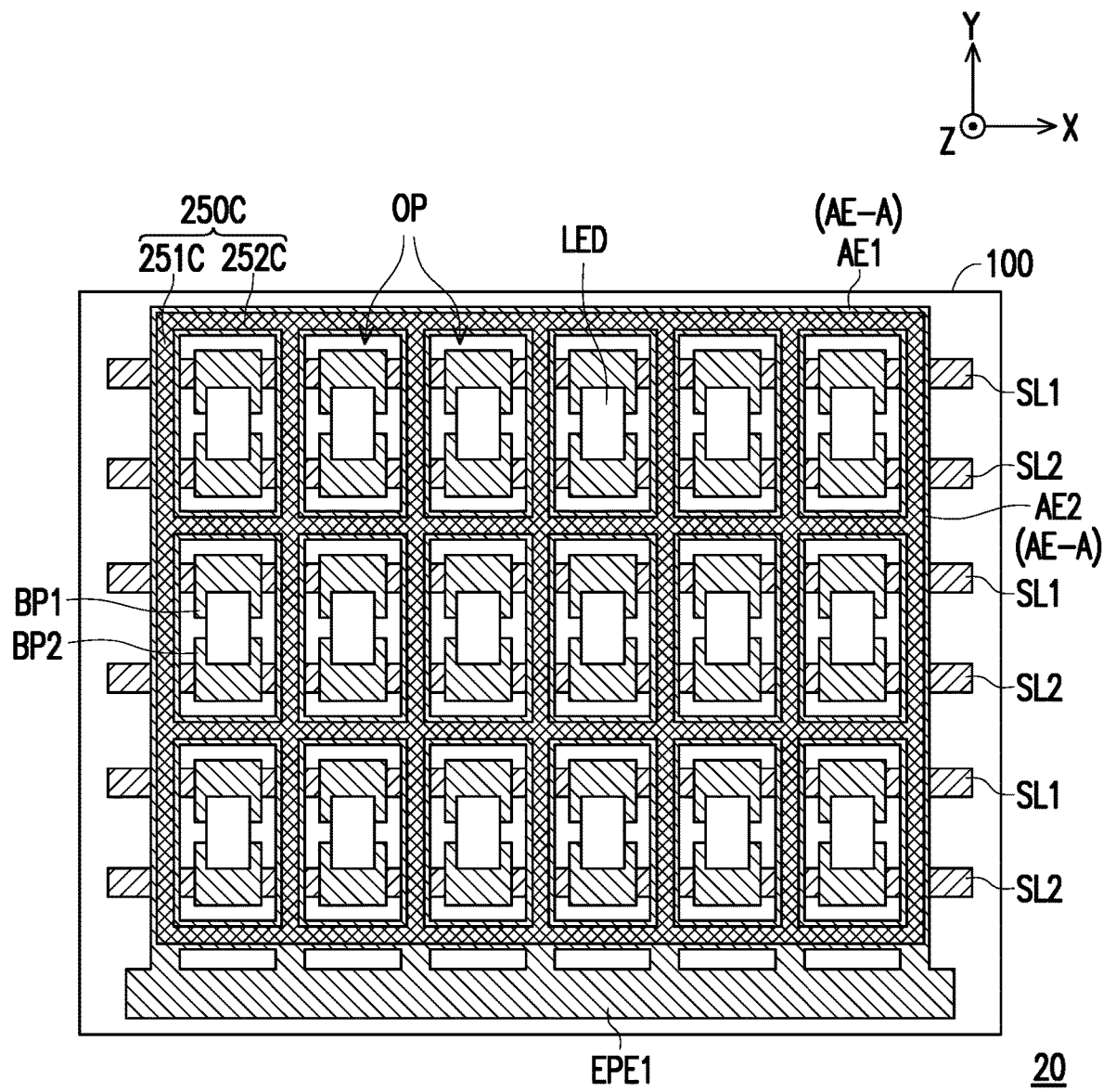
FIG. 10 is a schematic top view of a display panel according to a fifth embodiment of the disclosure.

FIG. 10 is a schematic top view of a display panel according to a fifth embodiment of the disclosure. With reference to FIG. 10, the difference between a display panel 20 of this embodiment and the display panel 10 of FIG. 1 lies in the configuration of the light-emitting devices and the reflective structure layer. In this embodiment, the light-emitting devices LED of the display panel 20 are in a one-to-one correspondence with the bonding pad groups (i.e., a combination of the first bonding pad BP1 and the second bonding pad BP2). That is, the light-emitting devices LED do not share a bonding pad.

As such, a plurality of second reflective patterns 252C of a reflective structure layer 250C and the bonding pad groups are alternately arranged along the direction Y, and the second reflective patterns 252C extend between the bonding pad groups in the direction X. More specifically, the second reflective patterns 252C do not overlap the bonding pads along the direction Z. In addition, each of a plurality of first reflective patterns 251C of the reflective structure layer 250C extends in the direction Y and extends across multiple first signal lines SL1 and multiple second signal lines SL2. In particular, the first reflective patterns 251C and the second reflective patterns 252C of the reflective structure layer 250C intersect each other and form a plurality of opening areas OP, and each opening area OP is provided with one light-emitting device LED.

In addition, to manufacture the reflective structure layer 250C, a plurality of auxiliary electrodes AE-A of the display panel 20 includes a plurality of first extension segments AE1 and a plurality of second extension segments AE2 intersecting each other. The first extension segments AE1 are arranged along the direction Y and extend in the direction X, and the second extension segments AE2 are arranged along the direction X and extend in the direction Y. In particular, since the reflective structure layer 250C of the embodiment is formed only on the auxiliary electrodes AE-A, the operating electrical properties of the display panel 20 may not be affected even if the electroplated electrode EPE1 is not cut off. As a result, the display panel 20 of this embodiment may also selectively retain the electroplated electrode EPE1 used in the electroplating process. Also as a result, in the method of fabricating the display panel 20, the cutting process (i.e., step S106 of FIG. 3) of the above embodiments is not included, helping to further reduce the number of steps in the manufacturing process of the display panel 20.

Figure 11:
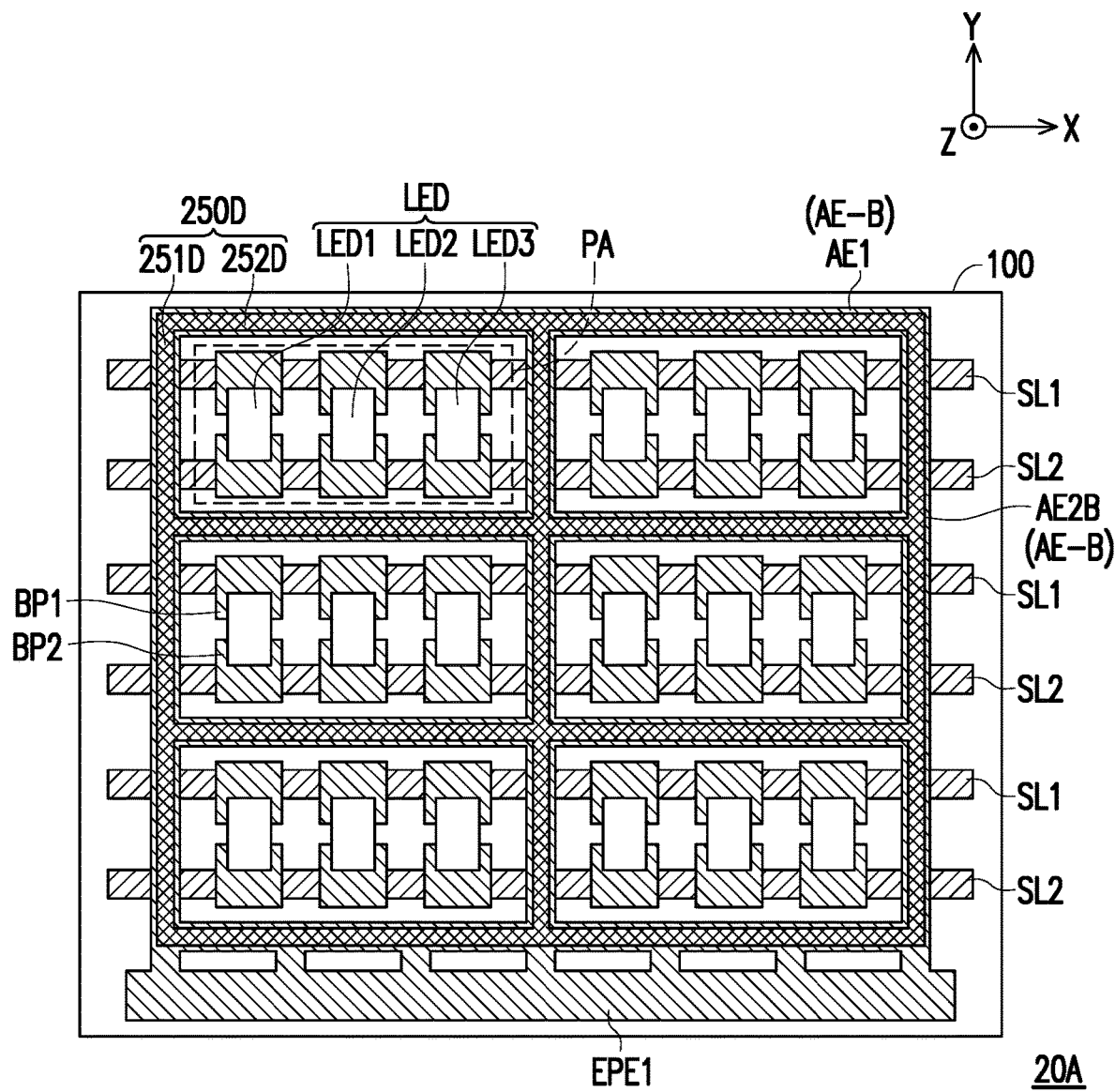
FIG. 11 is a schematic top view of a display panel according to a sixth embodiment of the disclosure.

FIG. 11 is a schematic top view of a display panel according to a sixth embodiment of the disclosure. With reference to FIG. 11, the difference between a display panel 20A of this embodiment and the display panel 20 of FIG. 10 lies in the configuration of the reflective structure layer. Specifically, in the display panel 20A, the arrangement of a plurality of first reflective patterns 251D of a reflective structure layer 250D and the light-emitting devices LED is different from that of the display panel 20 of FIG. 10.

For example, in this embodiment, the display panel 20A has the display pixel areas PA. In addition, the light-emitting devices LED include the first light-emitting devices LED1, the second light-emitting devices LED2, and the third light-emitting devices LED3. One first light-emitting device LED1, one second light-emitting device LED2, and one third light-emitting device LED3 are disposed in each display pixel area PA. Here, the first light-emitting devices LED1, the second light-emitting devices LED2, and the third light-emitting devices LED3 are respectively configured to emit light of different colors, such as red light, green light, and blue light, but the disclosure is not limited thereto.

In particular, the first reflective patterns 251D of the reflective structure layer 250D and the display pixel areas PA are alternately arranged along the direction X. That is, the reflective structure layer 250D of this embodiment is not arranged around each of the light-emitting devices LED. Correspondingly, a plurality of second extension segments AE2B of a plurality of auxiliary electrodes AE-B and the display pixel areas PA are also alternately arranged along the direction X. Notably, in this embodiment, the number of light-emitting devices LED disposed in each display pixel area PA is exemplified by using three light-emitting devices LED as an example. Nonetheless, it does not indicates that the disclosure is limited to the disclosed content of the drawings. In other embodiments, the number of light-emitting devices LED disposed in each display pixel area PA may be adjusted as required in actual application.

Figure 12:
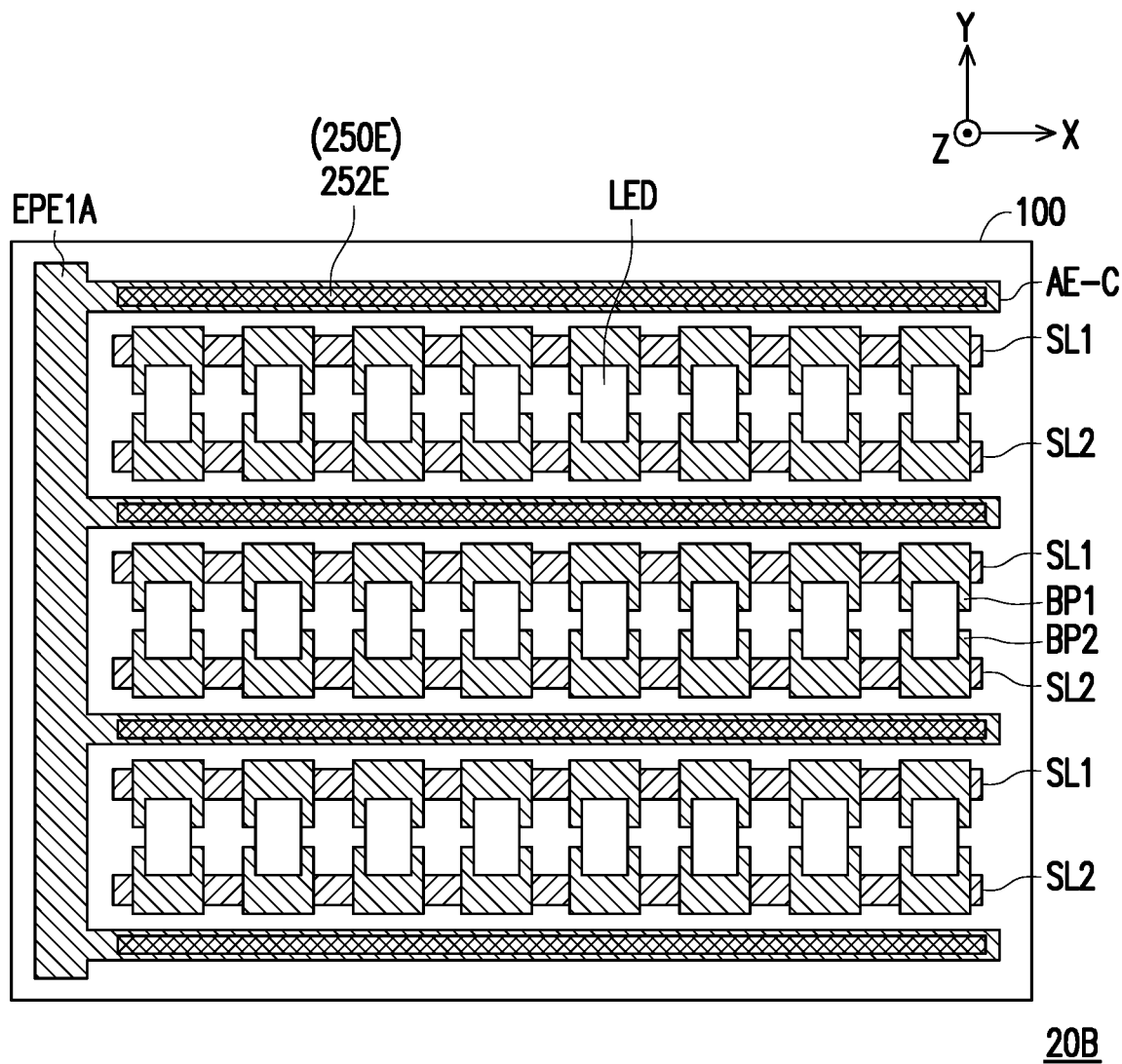
FIG. 12 is a schematic top view of a display panel according to a seventh embodiment of the disclosure.
Figure 13:
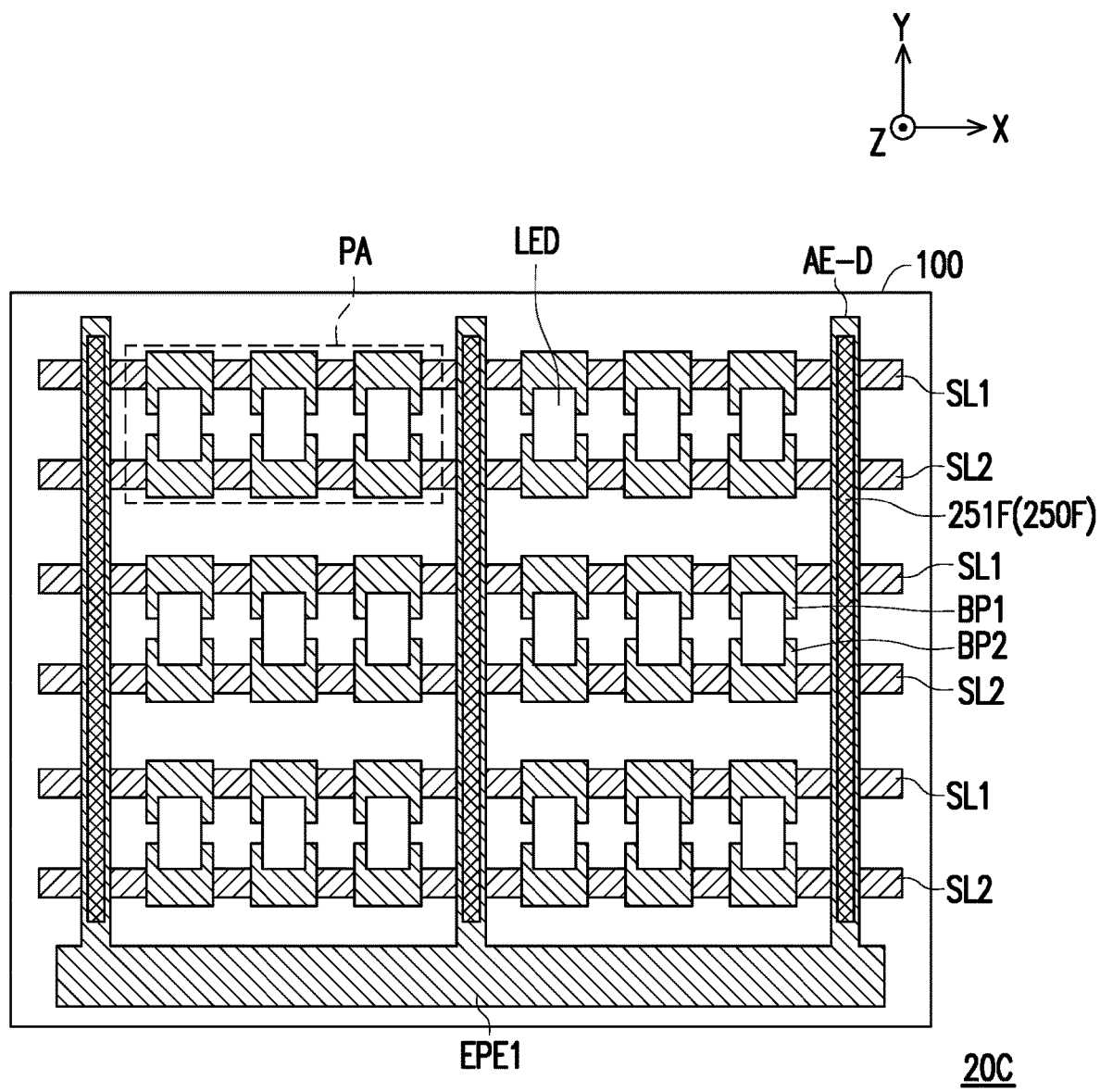
FIG. 13 is a schematic top view of a display panel according to an eighth embodiment of the disclosure.

FIG. 12 is a schematic top view of a display panel according to a seventh embodiment of the disclosure. FIG. 13 is a schematic top view of a display panel according to an eighth embodiment of the disclosure. With reference to FIG. 12, the difference between a display panel 20B of this embodiment and the display panel 20 of FIG. 10 lies in that a reflective structure layer 250E of the display panel 20B has only a plurality of second reflective patterns 252E extending in the direction X, and an electroplated electrode EPE1A to which a plurality of auxiliary electrodes AE-C are connected is disposed on a side of the display panel 20B along the direction X.

Nonetheless, the disclosure is not limited thereto. In other embodiments, a reflective structure layer 250F of a display panel 20C may also have only a plurality of first reflective patterns 251F extending in the direction Y. In addition, the first reflective patterns 251F and the display pixel areas PA are alternately arranged along the direction X. Correspondingly, a plurality of auxiliary electrodes AE-D and the display pixel areas PA are also alternately arranged along the direction X. Moreover, the retained electroplated electrode EPE1 is located on a side of the display panel 20C along the direction Y.

Figure 14:
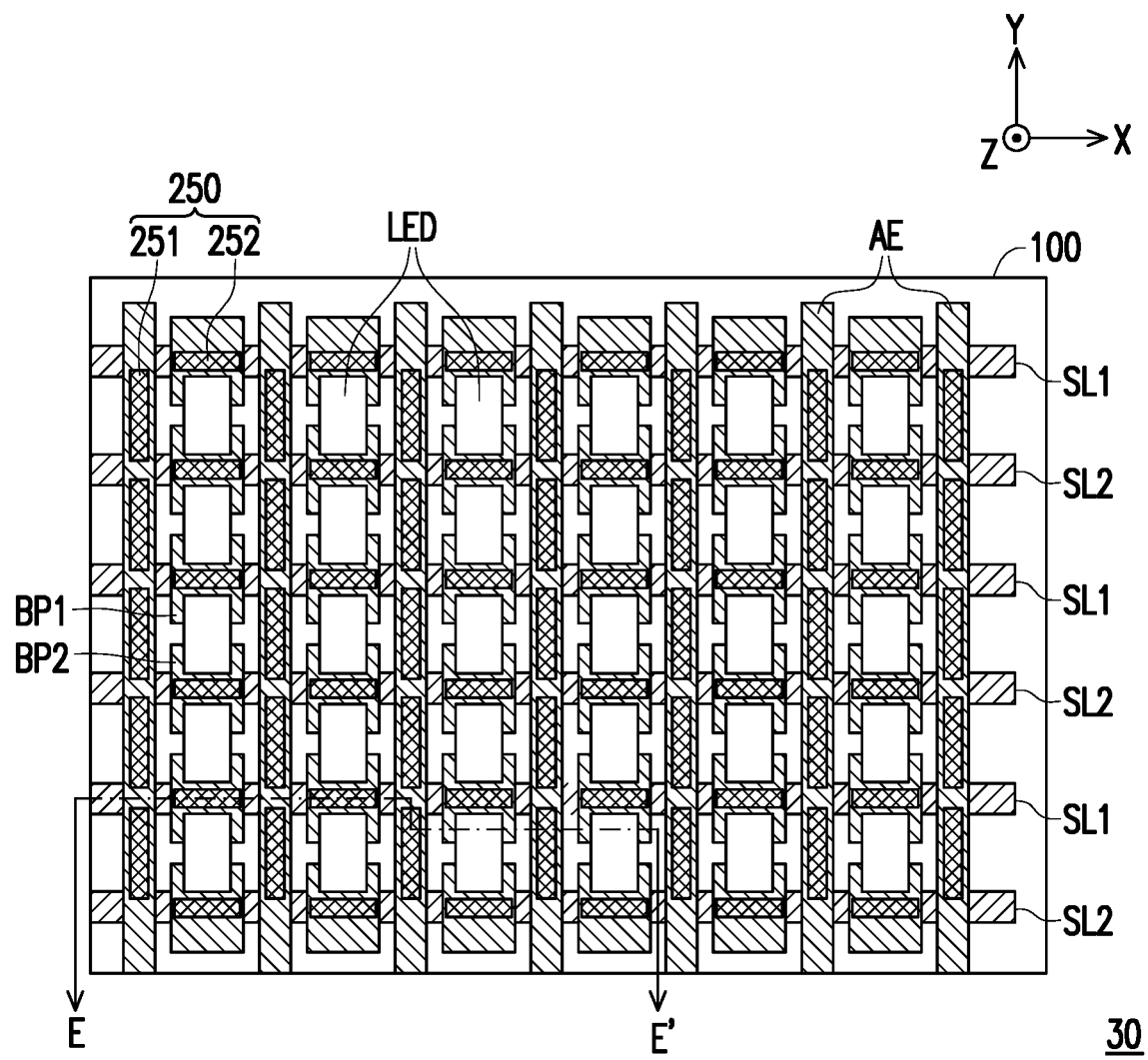
FIG. 14 is a schematic top view of a display panel according to a ninth embodiment of the disclosure.
Figure 16:
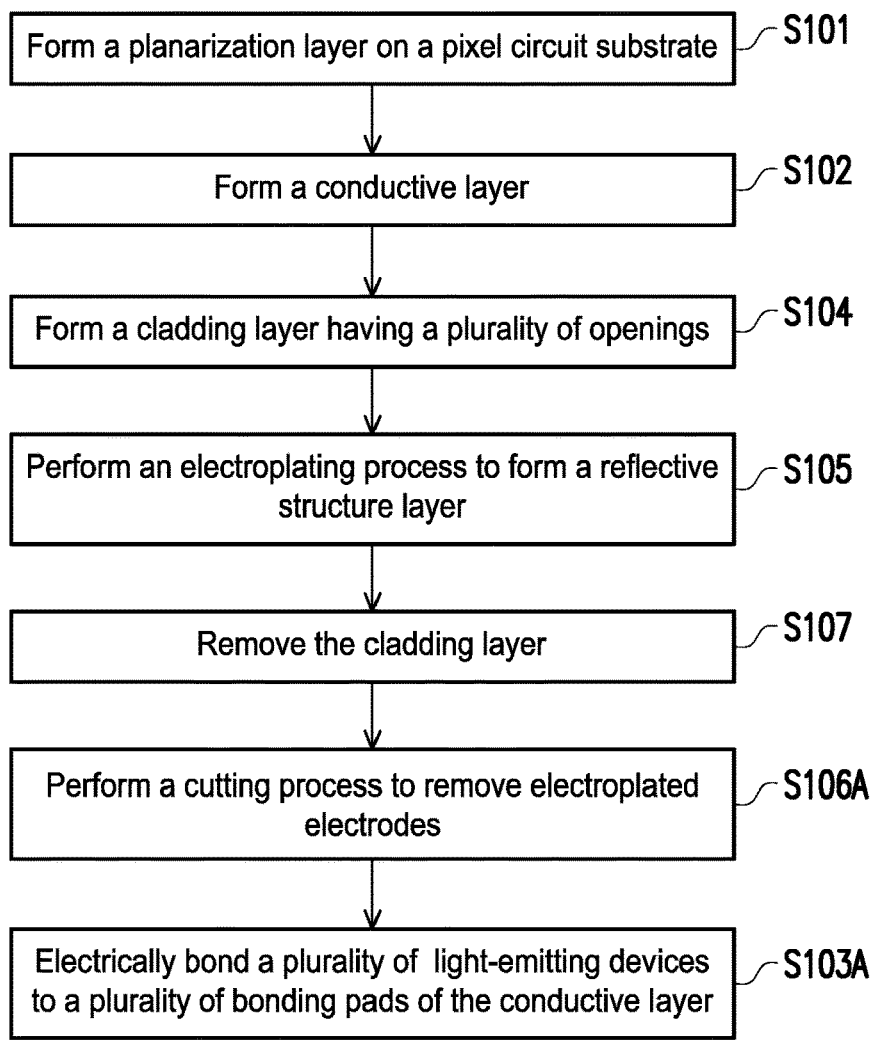
FIG. 16 is a flowchart of a method of fabricating the display panel of FIG. 14.
Figure 17A:
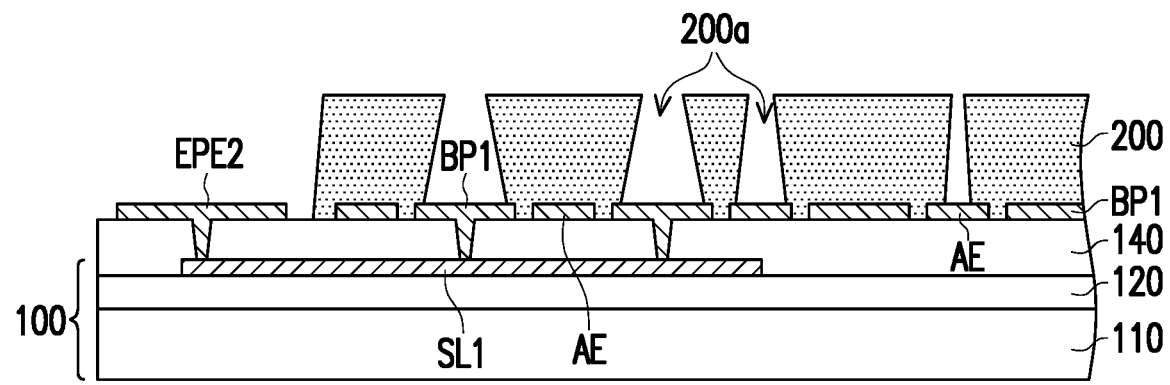
FIG. 17A to FIG. 17C are schematic cross-sectional views of a fabricating process of the display panel of FIG. 15.
Figure 17B:
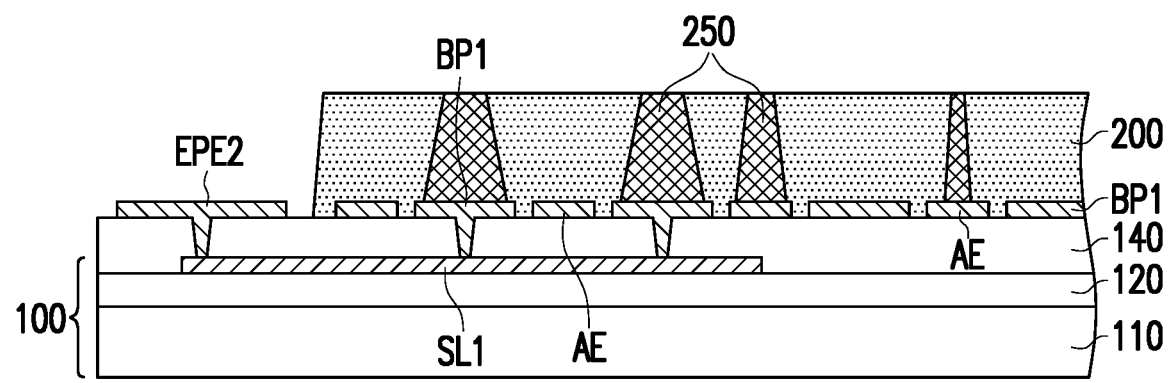
Figure 17C:
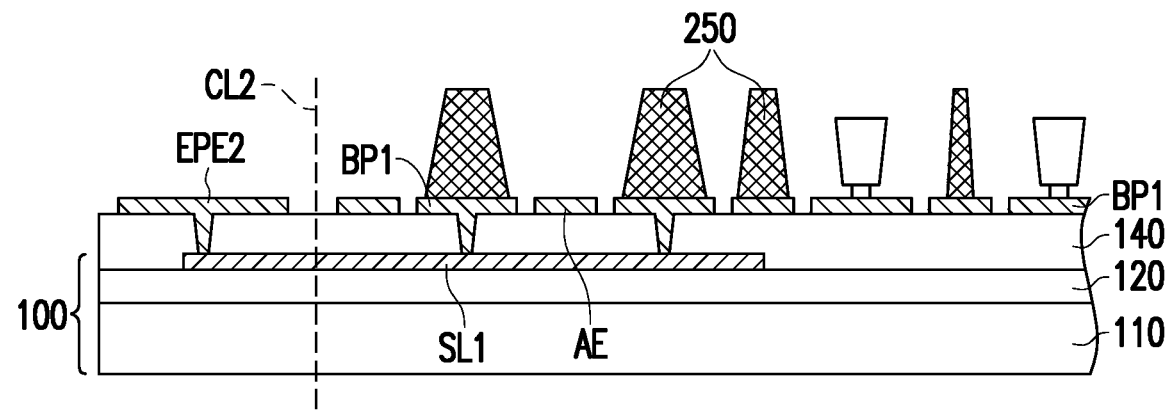

FIG. 14 is a schematic top view of a display panel according to a ninth embodiment of the disclosure. FIG. 15 is a schematic cross-sectional view of the display panel of FIG. 14. FIG. 15 corresponds to section line E-E' of FIG. 14. FIG. 16 is a flowchart of a method of fabricating the display panel of FIG. 14. FIG. 17A to FIG. 17C are schematic cross-sectional views of a fabricating process of the display panel of FIG. 15. For the sake of clarity in presentation, illustration of planarization layer 140 of FIG. 15 is omitted in FIG. 14.

With reference to FIG. 14 and FIG. 15, the difference between a display panel 30 of this embodiment and the display panel 10 of FIG. 1 lies in that the display panel 30 of this embodiment does not have the cladding layer 200 of the display panel 10 (as shown in FIG. 2A), and a method of fabricating the display panel 30 is also different from the method of fabricating the display panel 10.

The difference between the method of fabricating the display panel 30 and the method of fabricating the display panel 10 will be described below. With reference to FIG. 16 and FIG. 17A, different from the above embodiments, in the method of fabricating the display panel 30, after the step of forming the conductive layer is completed, the step of forming the cladding layer 200 is then performed (step S104). With reference to FIG. 16 and FIG. 17B, then, an electroplating process is performed to form the reflective structure layer 250 (step S105). In particular, to perform a step of bonding the light-emitting devices LED, in this embodiment, after the electroplating process of the reflective structure layer 250 is completed, a step of removing the cladding layer 200 is required to be performed (step S107).

With reference to FIG. 16 and FIG. 17C, after the step of removing the cladding layer 200 is completed, the step of bonding the light-emitting devices LED and a cutting process of electroplated electrodes (e.g., the electroplated electrode EPE1 and/or the electroplated electrode EPE2) are performed. In this embodiment, the step of bonding the light-emitting devices LED (step S103A) is performed after the cutting process of the electroplated electrodes (step S106A) is completed, but the disclosure is not limited to this. In other embodiments, the step of bonding the light-emitting devices LED may also precede the cutting process of the electroplated electrodes.

Since most of the steps in the method of fabricating the display panel 30 are similar to those of the display panel 10 of the above embodiments, reference may be made to the relevant paragraphs of the above embodiments for the detailed description, which will not be repeated herein.

Figure 18A:
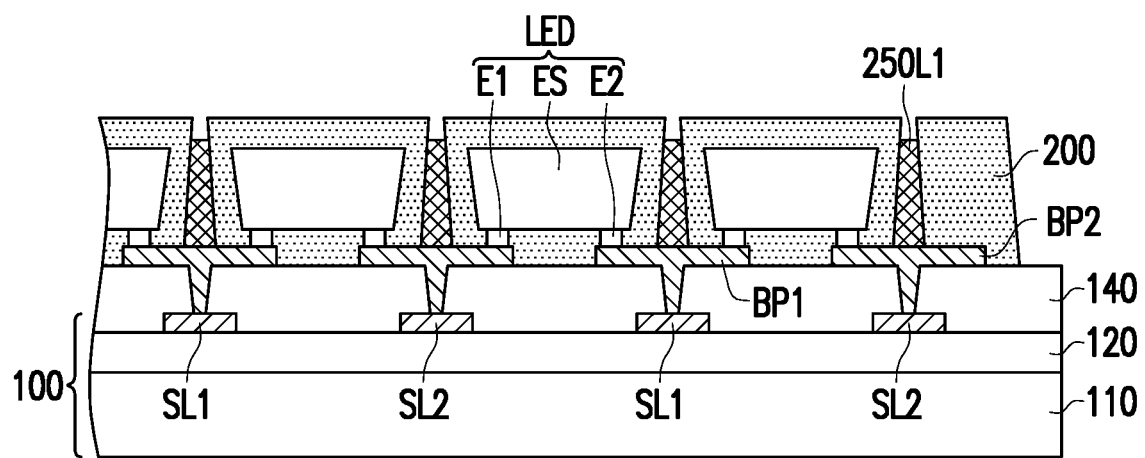
FIG. 18A and FIG. 18B are schematic cross-sectional views of a fabricating process of a display panel according to a tenth embodiment of the disclosure.
Figure 18B:
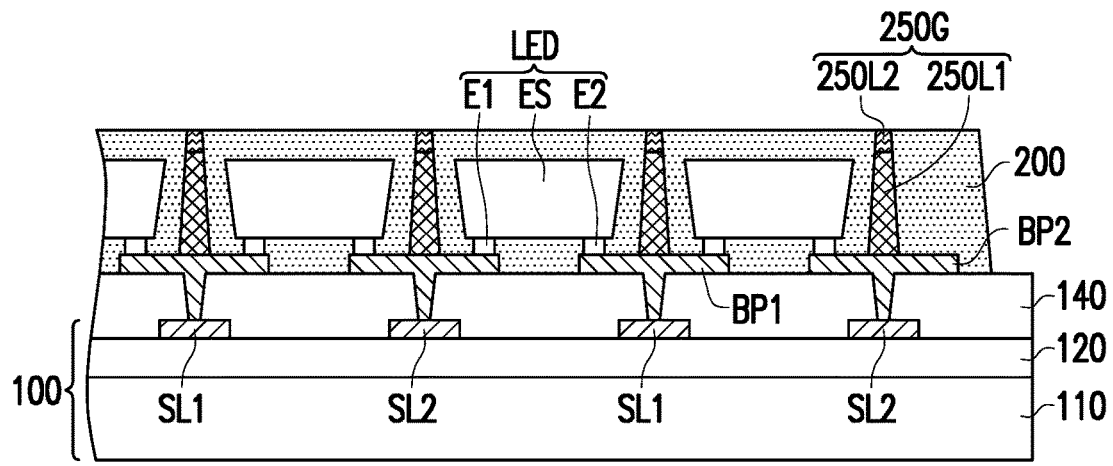

FIG. 18A and FIG. 18B are schematic cross-sectional views of a fabricating process of a display panel according to a tenth embodiment of the disclosure. With reference to FIG. 18A and FIG. 18B, the difference between a display panel 40 of this embodiment and the display panel 10 of FIG. 2A lies in the composition of the reflective structure layer. In this embodiment, a reflective structure layer 250G of the display panel 40 includes a high-reflectivity material layer 250L1 and a low-reflectivity material layer 250L2, and the high-reflectivity material layer 250L1 is located between the low-reflectivity material layer 250L2 and the bonding pads (e.g., the first bonding pads BP1 or the second bonding pads BP2).

In this embodiment, the material of the high-reflectivity material layer 250L1 may include metal materials with high reflectivity (e.g., copper, silver, aluminum, molybdenum, nickel, or chromium), and the material of the low-reflectivity material layer 250L2 may include blackened metal materials with low reflectivity (e.g., blackened chromium or blackened nickel) or organic photoresist materials. In particular, if the low-reflectivity material layer 250L2 is made of blackened metal material, the electroplating process of the reflective structure layer 250G of this embodiment may include not only a step of electroplating the high-reflectivity material layer 250L1 (as shown in FIG. 18A) but also a step of electroplating the low-reflectivity material layer 250L2 (as shown in FIG. 18B). Nonetheless, the disclosure is not limited to this. In another embodiment, the low-reflectivity material layer 250L2 may also be manufactured using a photolithography and etching process.

It is worth mentioning that through the configuration of the low-reflectivity material layer 250L2, the reflectivity of the reflective structure layer 250G to external ambient light can be reduced, thereby improving the dark-state performance and display contrast of the display panel 40.

Figure 19:
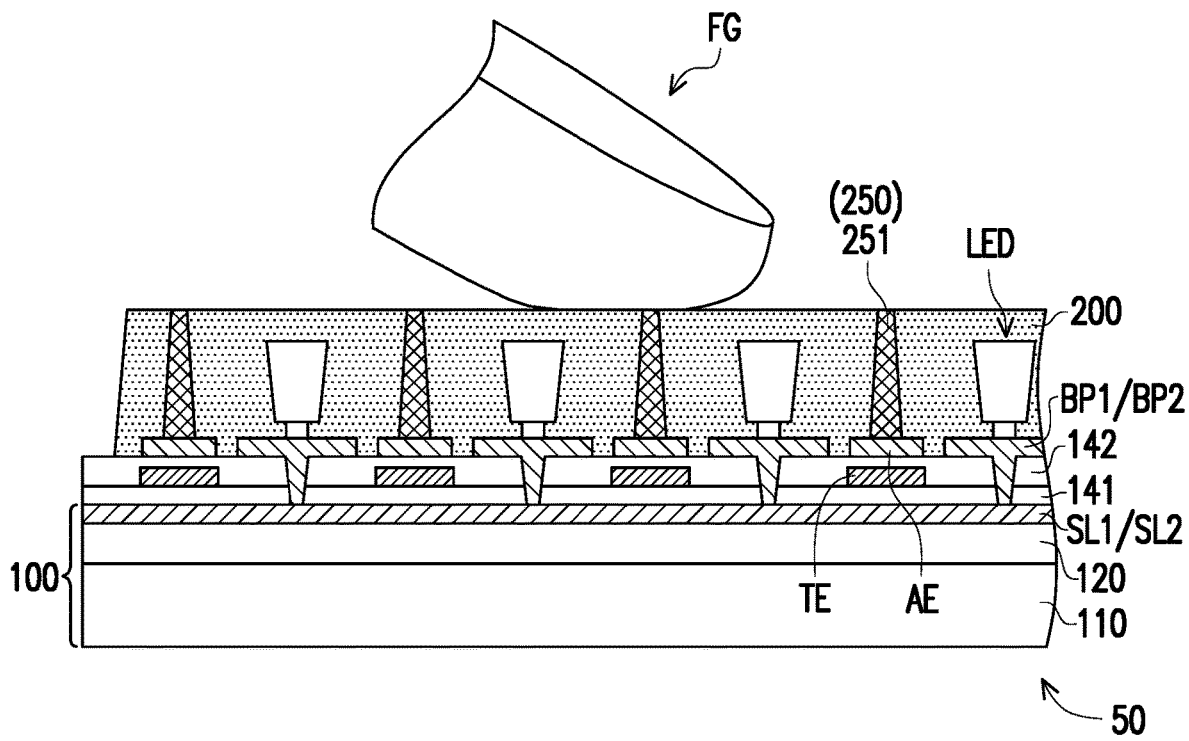
FIG. 19 is a schematic top view of a display panel according to an eleventh embodiment of the disclosure.

FIG. 19 is a schematic top view of a display panel according to an eleventh embodiment of the disclosure. With reference to FIG. 19, the difference between a display panel 50 of this embodiment and the display panel 10 of FIG. 2A and FIG. 2B lies in that the display panel 50 further includes a plurality of sensing electrodes TE, and the sensing electrodes TE are disposed between the auxiliary electrodes AE and the pixel circuit substrate 100. In particular, since the reflective structure layer 250 is conductive, through the sensing electrodes TE overlapping the first reflective patterns 251 of the reflective structure layer 250 and the auxiliary electrodes AE, a plurality of sensing capacitors for sensing a touch position of a finger FG may be formed.

From another point of view, a method of fabricating the display panel 50 of this embodiment may selectively include forming the sensing electrodes TE on the pixel circuit substrate 100 before the step of forming the conductive layer. To electrically insulate the sensing electrodes TE from the first signal lines SL1 and the second signal lines SL2 of the pixel circuit substrate 100 and from the bonding pads of the conductive layer, an insulating layer 141 is also disposed between the sensing electrodes TE and the pixel circuit substrate 100, and an insulating layer 142 is also disposed between the sensing electrodes TE and the conductive layer.

In summary of the foregoing, in the display panel and the method of fabricating the same according to an embodiment of the disclosure, the reflective structure layer is formed through an electroplating process on the bonding pads or on the auxiliary electrodes located between the bonding pads. The reflective structure layer reflects light emitted at a large angle by the light-emitting devices electrically bonded to the bonding pads back within the viewing angle range of the display panel, thereby increasing the light utilization efficiency of the display panel. Moreover, since the reflective structure layer is made by an electroplating process, not only the steps in the manufacturing process can be reduced, but the formed reflective structure layer also has a relatively high reflectivity in the visible light waveband.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A display panel, comprising:
    a pixel circuit substrate having a plurality of signal lines;
    a planarization layer covering the signal lines;
    a plurality of bonding pads disposed on the planarization layer and electrically connected to the signal lines;
    a plurality of light-emitting devices electrically bonded to the bonding pads;
    a plurality of auxiliary electrodes disposed between the bonding pads; and
    a reflective structure layer disposed between the light-emitting devices and overlapping at least part of the auxiliary electrodes and the bonding pads.

2. The display panel according to claim 1, further comprising:
    a cladding layer covering the light-emitting devices, the reflective structure layer, the bonding pads, and the auxiliary electrodes.

3. The display panel according to claim 1, wherein the reflective structure layer is electrically connected to at least part of the auxiliary electrodes and the bonding pads.

4. The display panel according to claim 1, wherein the reflective structure layer has a reflective surface facing each of the light-emitting devices, an included angle between the reflective surface and a bonding surface of each of the bonding pads or an included angle between the reflective surface and a surface of each of the auxiliary electrodes is between 65 degrees and 70 degrees, the reflective structure layer has a structural height in a normal direction of the bonding surface, each of the light-emitting devices has a device height in the normal direction of the bonding surface, and a ratio of the structural height to the device height is between 2 and 3.

5. The display panel according to claim 1, wherein the reflective structure layer comprises a high-reflectivity material layer and a low-reflectivity material layer, and the high-reflectivity material layer is located between at least part of the auxiliary electrodes and the bonding pads and the low-reflectivity material layer.

6. The display panel according to claim 1, wherein the reflective structure layer comprises a plurality of first reflective patterns, and the first reflective patterns and the light-emitting devices are alternately arranged along a first direction.

7. The display panel according to claim 6, wherein the light-emitting devices comprise a plurality of first light-emitting devices, a plurality of second light-emitting devices, and a plurality of third light-emitting devices, and the display panel has a plurality of display pixel areas, wherein one of the first light-emitting devices, one of the second light-emitting devices, and one of the third light-emitting devices are disposed in each of the display pixel areas, the reflective structure layer further comprises a plurality of second reflective patterns, the display pixel areas and the second reflective patterns are alternately arranged along a second direction, and the second direction intersects the first direction.

8. The display panel according to claim 6, wherein the reflective structure layer further comprises a plurality of second reflective patterns, the second reflective patterns and the light-emitting devices are alternately arranged along a second direction, and the second direction intersects the first direction.

9. The display panel according to claim 1, further comprising:
    an electroplated electrode disposed on the planarization layer and electrically connected to the auxiliary electrodes.

10. The display panel according to claim 1, wherein the reflective structure layer overlaps the auxiliary electrodes and the bonding pads.

11. The display panel according to claim 1, further comprising:
    a plurality of sensing electrodes disposed between the auxiliary electrodes and the pixel circuit substrate, wherein the reflective structure layer is electrically connected to the auxiliary electrodes, and the sensing electrodes respectively overlap the auxiliary electrodes.

12. A method of fabricating a display panel, comprising:
    forming a planarization layer on a pixel circuit substrate;
    forming a conductive layer on the planarization layer, wherein the conductive layer comprising a plurality of bonding pads, a plurality of auxiliary electrodes, and a first electroplated electrode, and the first electroplated electrode is electrically connected to the auxiliary electrodes;
    forming a cladding layer, wherein the cladding layer has a plurality of openings, and the openings respectively overlap at least part of the auxiliary electrodes and the bonding pads; and
    performing an electroplating process to form a reflective structure layer in the openings of the cladding layer.

13. The method according to claim 12, further comprising:
    before forming the cladding layer, performing bonding to electrically bond a plurality of light-emitting devices to the bonding pads.

14. The method according to claim 12, wherein the pixel circuit substrate has a plurality of signal lines and a second electroplated electrode, and the bonding pads penetrates the planarization layer and are electrically connected to the signal lines.

15. The method according to claim 14, wherein the electroplating process comprises:
    applying an electric potential to the first electroplated electrode and the second electroplated electrode.

16. The method according to claim 14, wherein after the electroplating process is completed, a cutting process is performed to remove the second electroplated electrode.

17. The method according to claim 16, wherein the cutting process further comprises removing the first electroplated electrode.

18. The method according to claim 12, further comprising:
    after completing the electroplating process, removing the cladding layer.

19. The method according to claim 18, further comprising:
    after removing the cladding layer, performing bonding to electrically bond a plurality of light-emitting devices to the bonding pads.

20. The method according to claim 12, wherein the electroplating process comprises:
    forming a high-reflectivity material layer; and
    forming a low-reflectivity material layer, wherein the high-reflectivity material layer is located between the conductive layer and the low-reflectivity material layer.

21. The method according to claim 12, further comprising:
    before forming the conductive layer, forming a plurality of sensing electrodes on the pixel circuit substrate, wherein the sensing electrodes respectively overlap the auxiliary electrodes.

* * * * *